United States Patent
Khenkin

(10) Patent No.: US 8,351,634 B2
(45) Date of Patent: Jan. 8, 2013

(54) SIDE-PORTED MEMS MICROPHONE ASSEMBLY

(75) Inventor: Aleksey S. Khenkin, Peterborough, NH (US)

(73) Assignee: Analog Devices, Inc., Norwood, MA (US)

( * ) Notice: Subject to any disclaimer, the term of this patent is extended or adjusted under 35 U.S.C. 154(b) by 1007 days.

(21) Appl. No.: 12/323,703

(22) Filed: Nov. 26, 2008

(65) Prior Publication Data

US 2010/0128914 A1 May 27, 2010

(51) Int. Cl.
H01L 23/495 (2006.01)
(52) U.S. Cl. ............... 381/361; 257/676; 257/415
(58) Field of Classification Search .............. 257/676, 257/666, E23.145; 324/686, 658; 438/123, 438/299
See application file for complete search history.

(56) References Cited

U.S. PATENT DOCUMENTS

| | | | |
|---|---|---|---|
| 6,421,444 B1 * | 7/2002 | Van Schyndel | 379/433.01 |
| 6,781,231 B2 | 8/2004 | Minervini | 257/704 |
| 7,304,732 B1 * | 12/2007 | Polcawich et al. | 356/246 |
| 7,550,828 B2 * | 6/2009 | Ramakrishna et al. | 257/676 |
| 7,763,488 B2 * | 7/2010 | Goodelle et al. | 438/51 |
| 7,902,843 B2 * | 3/2011 | Fang et al. | 324/686 |
| 2005/0069164 A1 * | 3/2005 | Muthuswamy et al. | 381/369 |
| 2005/0095813 A1 | 5/2005 | Zhu et al. | 438/459 |
| 2006/0237806 A1 * | 10/2006 | Martin et al. | 257/415 |
| 2007/0205492 A1 | 9/2007 | Wang | 257/659 |
| 2008/0247585 A1 * | 10/2008 | Leidl et al. | 381/360 |
| 2009/0180655 A1 | 7/2009 | Tien et al. | 381/361 |
| 2009/0263937 A1 * | 10/2009 | Ramakrishna et al. | 438/123 |
| 2010/0142742 A1 * | 6/2010 | Tanaka et al. | 381/346 |
| 2010/0202649 A1 * | 8/2010 | Inoda et al. | 381/361 |

(Continued)

FOREIGN PATENT DOCUMENTS

EP 0711095 A2 5/1996

(Continued)

OTHER PUBLICATIONS

European Patent Office; Authorized Officer: Michael Borowski, Notification of Transmittal of the International Search Report and the Written Opinion of the International Searching Authority, or the Declaration and the International Search Report, International Application No. PCT/US2009/065041, mailed Jul. 21, 2010, 10 pages.

(Continued)

*Primary Examiner* — Steven Loke
*Assistant Examiner* — David Goodwin
(74) *Attorney, Agent, or Firm* — Sunstein Kann Murphy & Timbers LLP

(57) ABSTRACT

A side-ported MEMS microphone package defines an acoustic path from a side of the package substrate to a microphone die disposed within a chamber defined by the substrate and a lid attached to the substrate. Optionally or alternatively, a circuit board, to which the microphone package is mounted, may define an acoustic path from an edge of the circuit board to a location under the microphone package, adjacent a bottom port on the microphone package. In either case, the acoustic path may be a hollow passage through at least a portion of the substrate or the circuit board. The passage may be defined by holes, channels, notches, etc. defined in each of several layers of a laminated substrate or circuit board, or the passage may be defined by holes drilled, molded or otherwise formed in a solid or laminated substrate or circuit board.

26 Claims, 18 Drawing Sheets

Section D-D

U.S. PATENT DOCUMENTS

| | | | | |
|---|---|---|---|---|
| 2010/0272302 | A1* | 10/2010 | Feiertag et al. | 381/361 |
| 2011/0062573 | A1* | 3/2011 | Zhe et al. | 257/680 |
| 2011/0156176 | A1* | 6/2011 | Huckabee et al. | 257/414 |

FOREIGN PATENT DOCUMENTS

| | | |
|---|---|---|
| EP | 1992589 | 11/2008 |
| JP | 04076795 U | 7/1992 |
| JP | 04076795 U | 7/1992 |
| WO | WO 2008/109399 | 9/2008 |
| WO | WO 2009/034786 | 3/2009 |

OTHER PUBLICATIONS

Beus, "MEMS Microphone Enables Better OEM and ODM Acoustic Designs," ECNmag.com, Oct. 1, 2005.

"First Signs of MEMS Microphone Introduction," *Silicon Microphone Marketplace 2007*, Nov. 28, 2007.

Authorized Officer Rosa Poquet, PCT/US2009/065041, Invitation to Pay Additional Fees and, Where Applicable, Protest Fee, Feb. 24, 2010.

* cited by examiner

Section A-A

Section B-B

Section B-B (Alternative)

Section B-B (Alternative)

Section D-D

Section D-D (Alternative)

Section Plane E-E

Section E-E

Section F-F  FIG. 28

SIDE-PORTED MEMS MICROPHONE ASSEMBLY

TECHNICAL FIELD

The present invention relates to microelectromechanical systems (MEMS) microphone packages and, more particularly, to side-ported MEMS microphone packages and related methods.

BACKGROUND ART

A typical microelectromechanical systems (MEMS) microphone package includes a substrate, such as an FR-4 based printed circuit board (PCB), a MEMS microphone die attached to the substrate and a cup-shaped lid or cover that is attached to the substrate to create a chamber, within which the microphone die is protected from environmental insults. The lid or the substrate defines an aperture, through which sound enters the chamber. For example, the substrate may define a through-hole under the microphone die. The microphone die detects the sound and generates corresponding electrical signals. In some implementations, other dies are co-located with the microphone die within the chamber, such as to process the electrical signals generated by the microphone die. The package typically includes electrical contact pads on the bottom surface of the substrate, by which the package can be mechanically and electrically connected to a circuit board, such as by solder or electrically conductive adhesive.

MEMS microphones are commonly used in mobile telephones, laptop computers, voice recorders and other electronic devices. These devices are typically made by placing printed circuit boards inside plastic housings. Often, the housings include user interface buttons or thin membranes, with which users may actuate electrical switches mounted on the printed circuit boards. The housings usually define ports (holes) adjacent the MEMS microphone packages, so the users' speech may enter the housing and be detected by the microphones.

Ergonomic considerations typically lead to microphone ports being located on thin sides, rather than on broad flat surfaces, of the electronic devices. For example, on a mobile telephone, the microphone port is typically located on the thin lower side of the telephone, near the bottom row of dial buttons. Because the main circuit board of the mobile telephone is co-planar with the front of the telephone, i.e., with the plane of the dial buttons, the MEMS microphone package is mounted on a differently oriented auxiliary circuit board (a "daughter board"), so as to orient the aperture of the MEMS microphone package in line with the port, i.e., along an axis that is parallel to the main circuit board.

The height of the resulting structure (i.e., the MEMS microphone package and daughter board) poses problems, because the electronic device must be thick enough to accommodate the height of the structure within the device housing. Demand for ever thinner mobile telephones and other electronic devices translates into a demand for a lower profile solution to mounting MEMS microphone packages on circuit boards.

U.S. Pat. No. 6,781,231 to Minervini, which is hereby incorporated by reference, discloses a MEMS microphone package in which an aperture is defined in a side of the microphone package lid. When the resulting side-ported MEMS microphone package is mounted on a main circuit board of a mobile telephone, the axis of the microphone package aperture is oriented in line with the telephone housing microphone port, and the MEMS microphone package presents a low profile. However, defining apertures in the sides of package lids is difficult and expensive and poses other problems.

SUMMARY OF THE INVENTION

An embodiment of the present invention provides a side-ported microphone package. The package may include a substrate and a lid attached to a first surface of the substrate to define a chamber therebetween. A microphone die may be disposed within the chamber. The substrate may at least partially define an acoustic path from outside the chamber to the microphone die, such that at least a portion of the acoustic path defined by the substrate is oriented other than perpendicular to the first surface of the substrate. For example, the at least a portion of the defined acoustic path may be oriented parallel to the first surface of the substrate.

The substrate may define an aperture in the first surface within a boundary defined by a locus of points where the lid is attached to the substrate. The substrate may also define an opening on a surface of the substrate and outside the boundary. The substrate may further define a hollow passage in communication with the aperture and with the opening, such that the passage, the aperture and the opening form at least a portion of the defined acoustic path.

The opening may be defined by a surface of the substrate that is substantially perpendicular to the first surface or by the first surface.

The substrate may include a second surface on substantially an opposite side of the substrate from the first surface. None or at least a portion of the passage may be open at the second surface.

The second surface may include a solderable portion configured into an open shape, which extends from a location proximate an edge of the substrate to another location proximate the same or a different edge of the substrate. The solderable portion may substantially bound the open portion of the passage between the solderable portion and the edge of the substrate. The solderable portion may be U shaped, with ends of the U shape proximate the edge of the substrate.

The substrate may include a laminate. A first layer of the laminate may define the aperture, and a second layer of the laminate may define at least a portion of the passage.

The aperture may be adjacent to, and in line with, a receiver portion of the microphone die. The microphone die may be disposed between the aperture and the chamber. The aperture may be in communication with the chamber.

The substrate may include a printed circuit board, ceramic and/or plastic. The substrate may include at least one wall, and the lid may be attached to the at least one wall.

Another embodiment of the present invention provides a side-ported microphone package that includes a substrate having a first surface and a second surface. The second surface is on substantially an opposite side of the substrate from the first surface. The microphone package also includes a lid attached to the first surface of the substrate to define a chamber therebetween. A microphone die may be disposed within the chamber. The second surface defines an opening. The substrate at least partially defines an acoustic path between the opening and the microphone die. The second surface comprises a solderable portion configured into an open shape that extends from a location proximate an edge of the substrate to another location proximate the same edge or a different edge of the substrate. The solderable portion substantially bounds the opening between the solderable portion and the edge of the substrate. However, the solderable portion does not surround the opening. The solderable portion may be U shaped, with ends of the U shape proximate the edge of the substrate.

Yet another embodiment of the present invention provides a side-ported microphone package that includes a substrate and a lid attached to the substrate to define a chamber therebetween. A microphone die may be disposed within the chamber. The substrate defines a sound input port in communication with the microphone die. The sound input port is oriented substantially perpendicular to the microphone die.

Another embodiment of the present invention provides a side-ported microphone package that includes a substrate having a top surface, a bottom surface and an end surface. The end surface defines an opening. A lid is attached to the substrate to define a chamber therebetween. A microphone die may be disposed within the chamber. The substrate defines at least a portion of an acoustic path from the opening to the microphone die.

An embodiment of the present invention provides a kit of parts for assembling a side-ported microphone package. The kit includes a first layer, a second layer, at least one wall and a lid. The first layer defines a hollow channel or notch in a surface of the first layer. The channel or notch extends from an edge of the first layer and terminates at a location away from any edge of the first layer. The second layer defines a bore. When the first and second layers are assembled in registration with each other, the bore is in communication with the channel or notch of the first layer. When the at least one wall is attached to the second layer in registration therewith, the bore in the second layer is in communication with a volume defined by the at least one wall.

The first layer and the second layer may each include a printed circuit board, ceramic, plastic and/or another material. Optionally or alternatively, the lid may include a printed circuit board.

Yet another embodiment of the present invention provides a method for producing a side-ported microphone package. A microphone die is disposed, relative to a substrate. A lid is attached to a first surface of the substrate to define a chamber within which the microphone die is, or will be, disposed. At least a portion of an acoustic path is defined from outside the chamber, through at least a portion of the substrate, to an aperture defined by the first surface. The aperture is within a boundary defined by a locus of points where the lid is, or will be, attached to the substrate. At least a portion of the defined acoustic path is oriented other than perpendicular to the first surface of the substrate.

A plurality of layers of the substrate may be laminated to define the at least a portion of the acoustic path. A first layer of the substrate may define the first aperture, and a second layer of the substrate may define at least a portion of the acoustic path.

The at least a portion of the acoustic path may be defined, at least in part, by boring at least one hole at least partially through the substrate. Optionally or alternatively, the at least a portion of the acoustic path may be defined, at least in part, by defining an opening in a second surface of the substrate that is substantially perpendicular to the first surface, so the opening is in communication with the acoustic path. Optionally or alternatively, the at least a portion of the acoustic path may be defined, at least in part, by defining an opening in the first surface, the opening being in communication with the acoustic path. Optionally or alternatively, the at least a portion of the acoustic path may be defined, at least in part, by defining an opening in a second surface of the substrate, the second surface being on substantially an opposite side of the substrate from the first surface, the opening being in communication with the acoustic path Optionally or alternatively, a solderable portion may be provided on the second surface. The solderable portion may be configured into an open shape. The solderable portion may extend from a location proximate an edge of the substrate to another location proximate the same or a different edge of the substrate. The solderable portion may substantially bound the opening between the solderable portion and the edge of the substrate.

The solderable portion may be U shaped, with ends of the U shape proximate the edge of the substrate.

another embodiment of the present invention provides a method for producing a side-ported microphone assembly. A bottom side of a bottom-ported microphone package is attached to a surface of a circuit board. An opening is defined in the surface of the circuit board adjacent a present or expected future location of the bottom port of the microphone package. A hollow acoustic path is defined from a side of the circuit board, through at least a portion of the circuit board, to the opening.

The acoustic path may be defined by laminating a plurality of layers of the circuit board. A first layer of the circuit board defines the opening, and a second layer of the circuit board defines at least a portion of a hollow passage in communication with the opening and extending to the side of the circuit board.

The acoustic path may be defined by boring at least one hole at least partially through the circuit board. The hole may be in communication with the opening.

Optionally, a solderable portion may be provided on the surface of the circuit board. The solderable portion may be configured into an open shape. The solderable portion may extend from a location proximate an edge of the circuit board to another location proximate the same or a different edge of the circuit board. The solderable portion may substantially bound the opening between the solderable portion and the edge of the circuit board.

BRIEF DESCRIPTION OF THE DRAWINGS

The invention will be more fully understood by referring to the following Detailed Description of Specific Embodiments in conjunction with the Drawings, of which.

DETAILED DESCRIPTION OF SPECIFIC EMBODIMENTS

In accordance with embodiments of the present invention, methods and apparatus are disclosed for providing side-ported microphone packages and side-ported microphone assemblies. The substrate of a microelectromechanical systems (MEMS) microphone package may at least partially define an acoustic path from a side of the substrate to a microphone die disposed within a chamber defined by the substrate and a lid attached to the substrate. The acoustic path may be a hollow passage through at least a portion of the substrate. Optionally or alternatively, a circuit board, to which the MEMS microphone package is mounted, may define an acoustic path, such as via a hollow passage, from an edge of the circuit board to a location under the MEMS microphone package, adjacent a bottom port on the microphone package.

Traditionally, a port in a MEMS microphone package is defined in the lid, which is typically at least partially made of electrically conductive metal, so as to protect the microphone die and other circuits inside the package from electrical noise. Alternatively, a traditional MEMS microphone package defines a bottom port, i.e., a hole through the substrate of the package, directly under the microphone die. Both designs suffer from various problems. For example, use of a bottom-ported MEMS microphone package creates the daughter board and structure height problems described above. On the other hand, conventional side-ported packages, with ports in the sides of their lids, can lead to degraded audio quality, due to the audio response characteristics of the chamber, through which sound must travel before reaching the microphone die. These and other shortcomings are overcome by the packages and methods disclosed herein.

Surprisingly, it has been found that a MEMS microphone die can be effectively acoustically coupled to a microphone port on an electronic device, at least in part, via an acoustic path defined within a substrate of a MEMS microphone package. One would not have expected sound to propagate well through such a path, in part due to the sharp angle or tortuous geometry of such a path.

Figure 1:
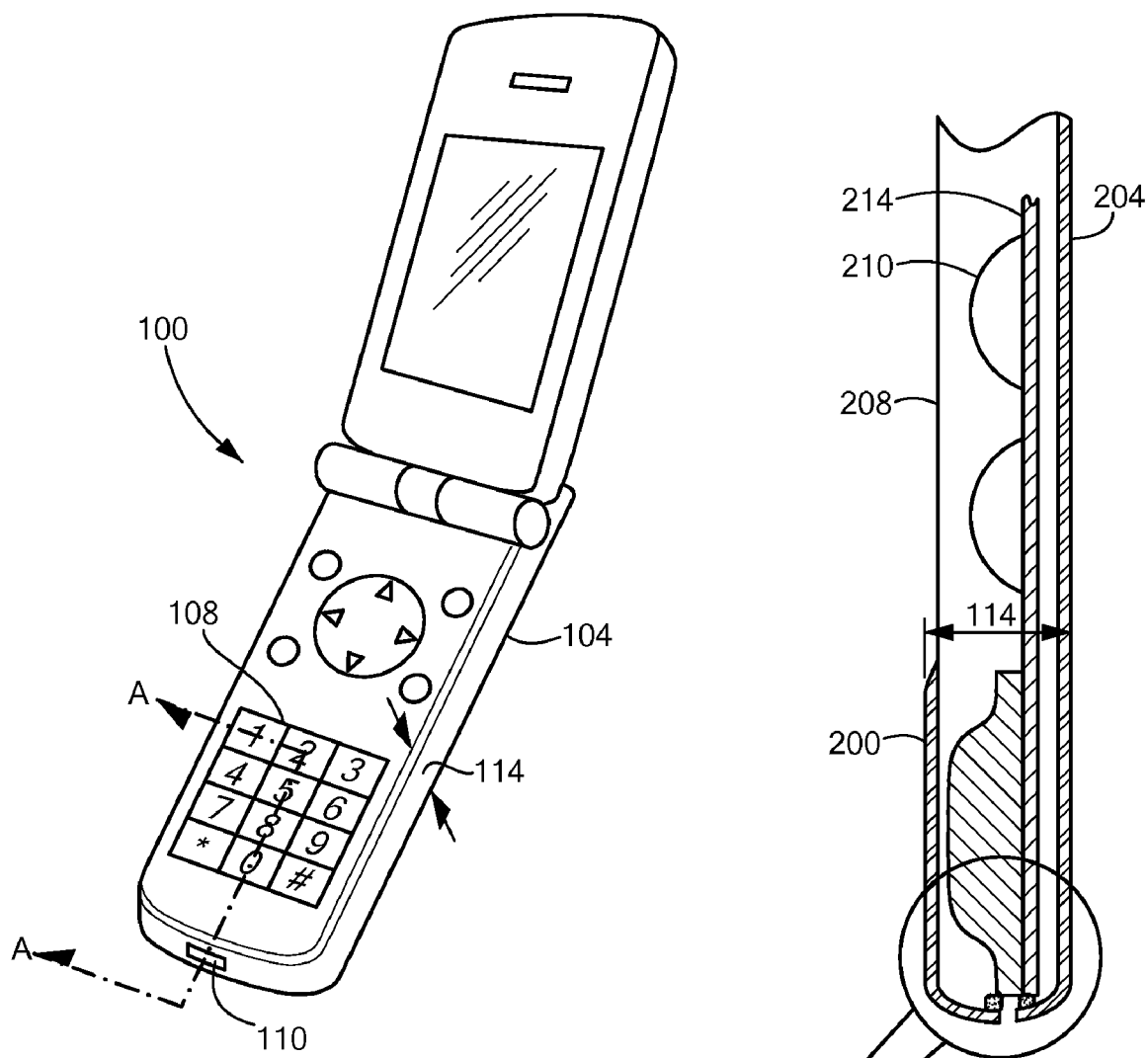
FIG. 1 is a perspective view of an exemplary mobile telephone, in which embodiments of the present invention may be used.
Figure 2:
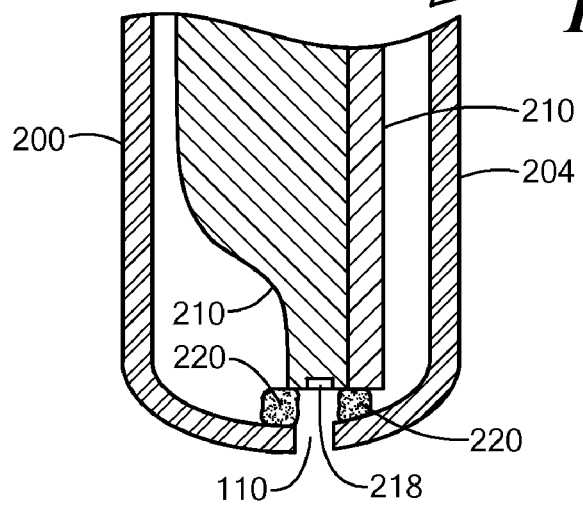
FIG. 2 is a cross-sectional view of a portion of the mobile telephone of FIG. 1.
Figure 3:
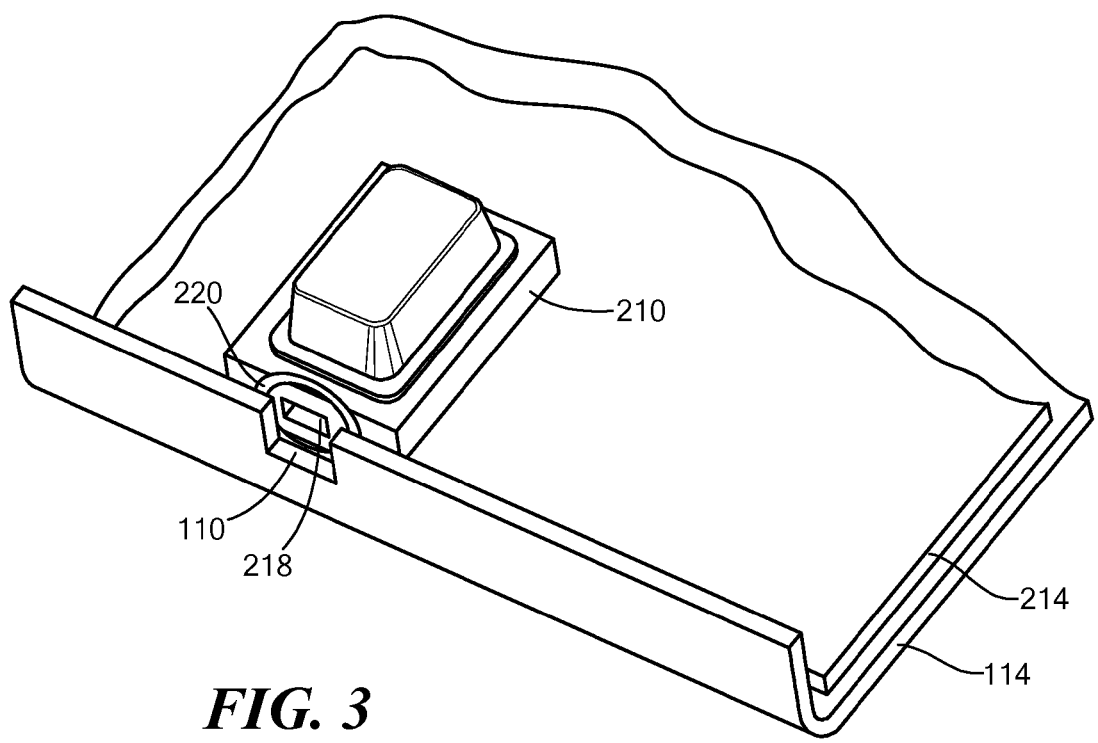
FIG. 3 is a more detailed perspective view of an interior portion of the mobile telephone of FIG. 1.

As noted, mobile telephones and other electronic devices use MEMS microphones. These electronic devices provide contexts in which the present inventions may be practiced. One exemplary context, a mobile telephone, will now be described. FIG. 1 is a perspective view of a mobile telephone 100, FIG. 2 is a cross-sectional view of a portion of the mobile telephone 100, and FIG. 3 is a more detailed perspective view of a portion of the inside of the mobile telephone 100. The mobile telephone 100 includes a housing 104 that is typically of a "clam shell" design, i.e., the housing 104 is made of a front half 200 and a back half 204 that snap together or are adhered or welded together. The mobile telephone 100 typically includes a set of dial buttons 108, which is implemented as a thin membrane 208, by which a user may actuate electrical switches (typified by switch 210) mounted on a main circuit board 214 disposed within the housing 104, i.e., between the front half 200 and the back half 204 of the housing 104.

The housing 104 defines a microphone port 110, i.e., a hole through which sound enters the housing 104. A MEMS microphone package 210 is attached to the circuit board 214 near an edge of the circuit board 214, preferably adjacent the microphone port 110. The microphone package 210 defines an input aperture 218, through which sound enters the microphone package 210. The MEMS microphone package 210 should be positioned such that the aperture 218 is close to, and oriented toward, the microphone port 110. Optionally, a resilient material, an adhesive or Another suitable material forms a gasket 220 between the inside of the housing 104 and the microphone package 210 and/or the circuit board 214, so as to create a relatively sealed acoustic path from the microphone port 110 to the input aperture 218.

As noted, markets demand ever thinner electronic devices. Thus, there is a need for thin (as measured by thickness 114) mobile telephones. A side-ported MEMS microphone package, such as the package 210, facilitates meeting this need, because the microphone package 210 may be mounted on, and parallel to, the main circuit board 214, without the need for a daughter board or other arrangement for orienting a lid port or a bottom port of the microphone package towards the microphone port 110 of the mobile telephone 100. Furthermore, a MEMS microphone package 210 having an input aperture 218 on the side of the package substrate, rather than on the side of the lid (as in the prior art), facilitates locating the microphone package input port 218 as close as desired to the edge of the circuit board 214, thus closer to the microphone port 110 of the mobile telephone housing 104 than is possible with prior art microphone packages. Optionally, the MEMS microphone package 210 may be mounted so as to partially overhang the edge of the circuit board 214, thereby locating the input port 218 even closer to the microphone port 110 of the housing 104.

Figure 4:
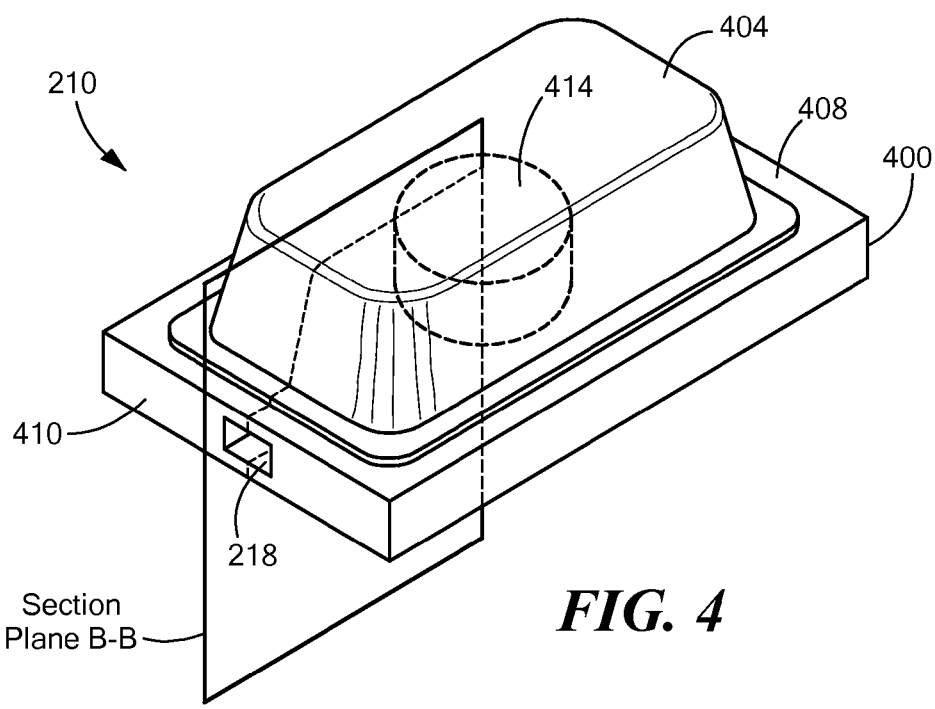
FIG. 4 is a perspective view of a side-ported MEMS microphone package, according to embodiments of the present invention.

Several exemplary embodiments of the present invention will now be described. FIG. 4 is a perspective view of an exemplary side-ported MEMS microphone package 210. The package 210 includes a substrate 400 and a lid 404 attached to one surface 408 of the substrate 400 to define a chamber therebetween. The lid 404 may be attached to the substrate 400 by solder, brazing, adhesive or any other suitable material or method. In some embodiments, the lid is cup shaped. A MEMS microphone die 414 (shown in phantom) is disposed in the chamber. Another surface 410 of the substrate 400 defines the input aperture 218. A hollow passage provides at least part of an acoustic path from the input aperture 218 to the microphone die 414, as described in more detail below. Although the passage is described as "hollow," a mechanical filter may be fitted in all or part of the passage to prevent moisture or particles of contaminant from entering the chamber. An acoustic path with such a filter is nevertheless considered "hollow."

Because the input aperture 218 is oriented perpendicular to the typical orientation of the MEMS microphone die 414, the acoustic path should include a bend or angle to direct sound propagating along the acoustic path toward the microphone die 414. The acoustic path may be formed in various ways, examples of which will now be described.

According to some embodiments, the substrate 400 is laminated, i.e., formed by uniting a plurality of layers of material together. The acoustic path may be defined by a set of passages formed by holes, notches, cuts, channels or other openings in some or all of the layers of the substrate 400. In other embodiments, the substrate 400 is solid, and the acoustic path may be formed by holes channels, notches, etc., bored, molded or otherwise formed in the substrate 400. Exemplary embodiments will be described with reference to cross-sectional views of variations of microphone package 210, taken according to section plane B-B in FIG. 4.

Figure 5:
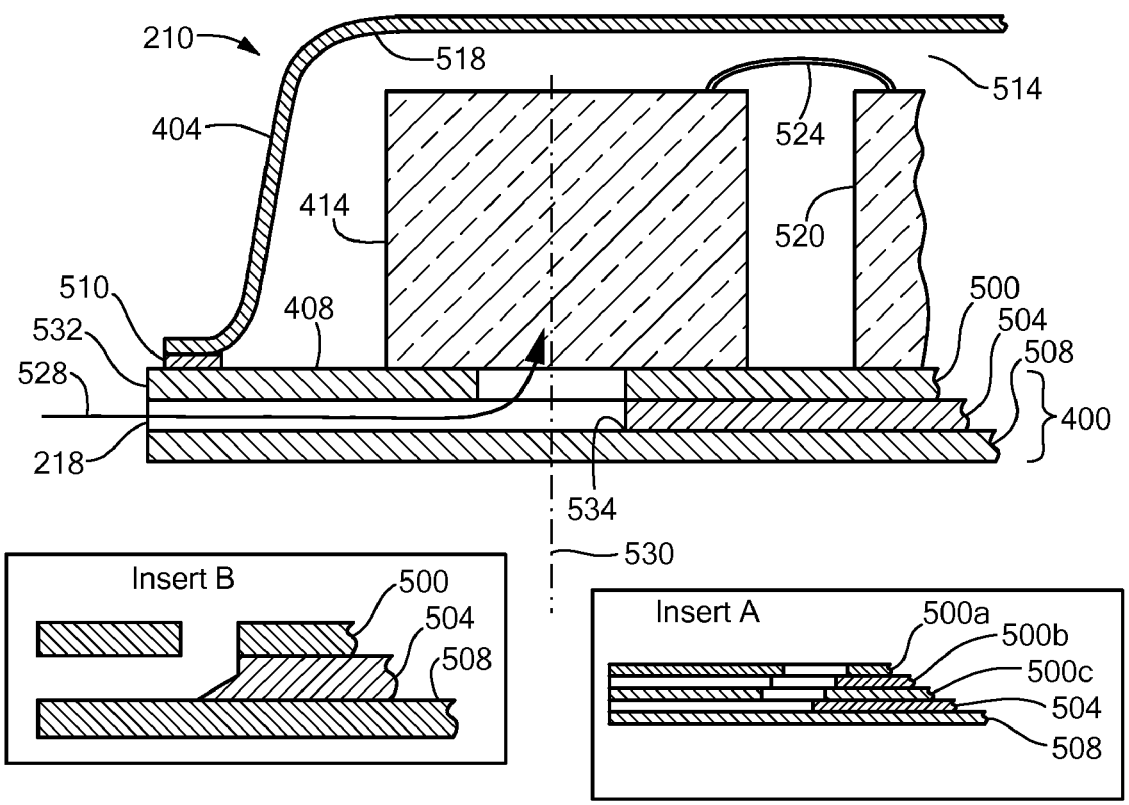
FIG. 5 is a cross-sectional view of a portion of the MEMS microphone package of FIG. 4, according to one embodiment of the present invention.

FIG. 5 is a cross-sectional view of an exemplary MEMS microphone package 210 that includes a laminated substrate 400. The substrate 400 shown in FIG. 5 includes three layers 500, 504 and 508. However, other numbers of layers may be used. As noted, the lid 404 is attached to one surface 408 of the substrate 400 by solder or adhesive 510, or another suitable material or method, to define a chamber 514. The MEMS microphone die 414 (shown as a solid block for simplicity) may be attached to the surface 408 of the substrate 400, as shown in FIG. 5. Alternatively, the microphone die 414 may be attached to the underside 518 of the lid 404, or the microphone die 414 may be otherwise disposed within the chamber 514. Optionally, other circuits, such as an application-specific integrated circuit (ASIC) 520 may be included in the chamber 514 and may be connected to the microphone die 414 by wire bonds 524 or other suitable electrical connections, such as to process signals generated by the microphone die 414. The substrate 400 defines an acoustic path 528 through at least a portion of the substrate 400, from the input aperture 218 to the microphone die 414.

Figure 6:
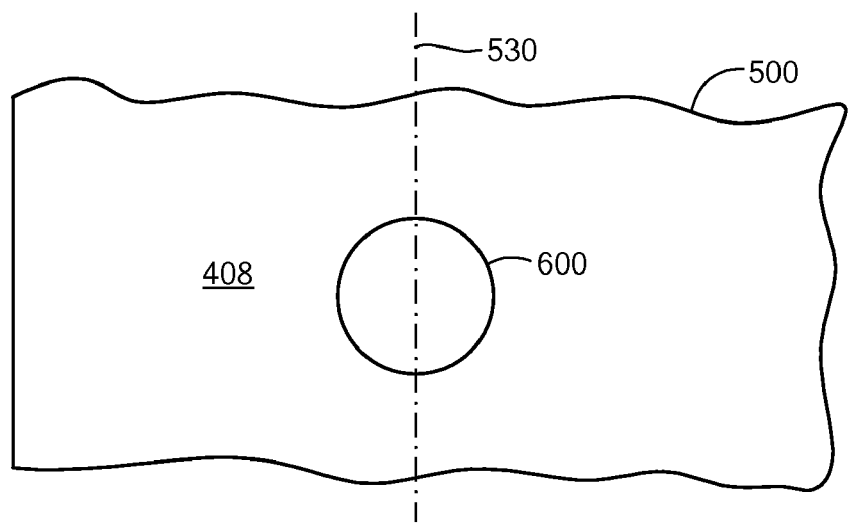
FIG. 6 is a plan view of a layer of a substrate of the side-ported MEMS microphone package of FIG. 5.

FIG. 6 is a plan view of a portion of the top layer 500 of the substrate 400. The top layer 500 defines a hole 600 therethrough. Thus, the top layer 500 defines an aperture in the top surface 408 of the finished substrate 400. The hole 600 is positioned on the layer 500 such that, when the microphone die 414 is attached to the substrate 400, the hole 600 is in communication with a receiver portion (not shown) of the microphone die 414, i.e., the hole is locate and oriented such that an acoustic signal exiting the hole enters the receiver portion of the microphone die 414, although the acoustic signal may pass through a portion of the chamber 514 before reaching the receiving portion of the microphone die 414. The hole 600 may be centered under the receiver portion of the microphone die 414, as indicated by center line 530. Although FIG. 5 shows no gap between the microphone die 414 and the substrate 400, a gap may be present due, for example, to the thickness of solder, adhesive or other material used to attach the microphone die 414 to the substrate 400, or due to other structures (not shown) that may be disposed between the microphone die 414 and the substrate 400.

Figure 7:
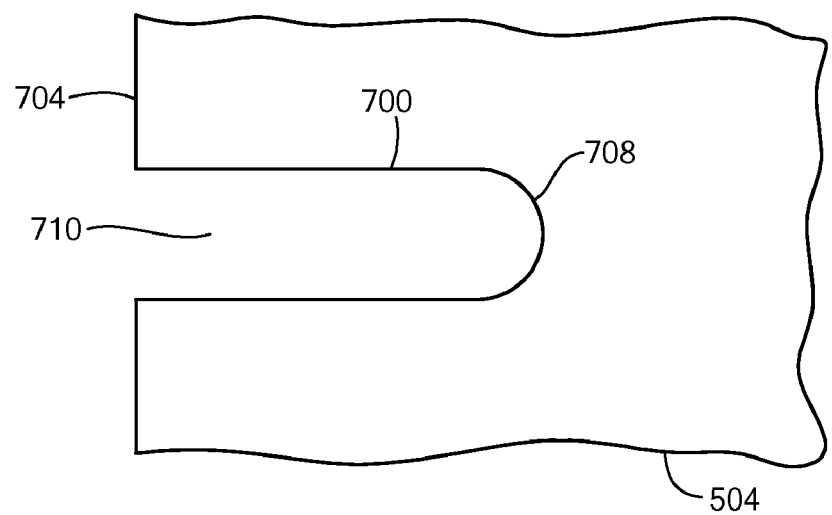
FIG. 7 is a plan view of another layer of the substrate of the side-ported MEMS microphone package of FIG. 5.

FIG. 7 is a plan view of a portion of the middle layer 504 of the substrate 400. The middle layer 504 defines a notch 700 that extends to a side 704 of the layer 504. The notch 700 is positioned on the layer 504 such that, when the top layer 500 and the middle layer 504 are laminated together, the hole 600 (FIG. 6) in the top layer 500 registers with, or at least partially overlaps, a portion 708 of the notch 700 to form part of the acoustic path 528. Another portion 710 of the notch 700 forms all or part of the input aperture 218.

When the bottom layer 508 is laminated to the middle layer 504, the bottom layer 508 seals the bottom portion of the acoustic path 528. Other numbers of layers may be used. For example, several layers similar or identical to the top layer 500 may be laminated together to obtain a desired thickness, strength or for another reason. For example, as shown in FIG. 5, Insert A, multiple layers 500a, 500b and 500c, each defining a hole, but at staggered locations, may be laminated together to form a curved or slanted portion of the acoustic path 528. Similarly, multiple layers similar or identical to the middle layer 504 may be laminated together, and multiple bottom layers, similar or identical to the bottom layer 508, may be laminated together. Although one right-angled acoustic path 528 is shown in FIG. 5, any number of, or shape, acoustic path(s) may be formed by an appropriate combination of layers with appropriate holes, holes formed at angles, notches, etc. Furthermore, although a right angle transition 534 is shown between the hole 600 in the top layer and the notch 700 in the middle layer, the transition may be angled (as shown in FIG. 5, Insert B), curved or have another shape.

Returning to FIG. 5, it can be seen that the sound input port 218 is oriented horizontally, i.e., substantially perpendicular to the vertical orientation (as indicated by the center line 530) of the receiver portion of the microphone die 414. Furthermore, the lid 404 and the microphone die 414 are attached to the top surface 408 of the substrate 400, while an end surface 532 (which may also be referred to as a "side surface") defines the sound input port 218 (which may also be referred to as an "opening").

During manufacture, the substrates 400 should be singulated by laser dicing, by breaking sheets of substrates along score lines or by some other dry method, rather than cutting the substrate sheets with a water-cooled/lubricated saw, to avoid water infiltration into the microphone package 210, such as through the sound input port 218.

Figure 8:
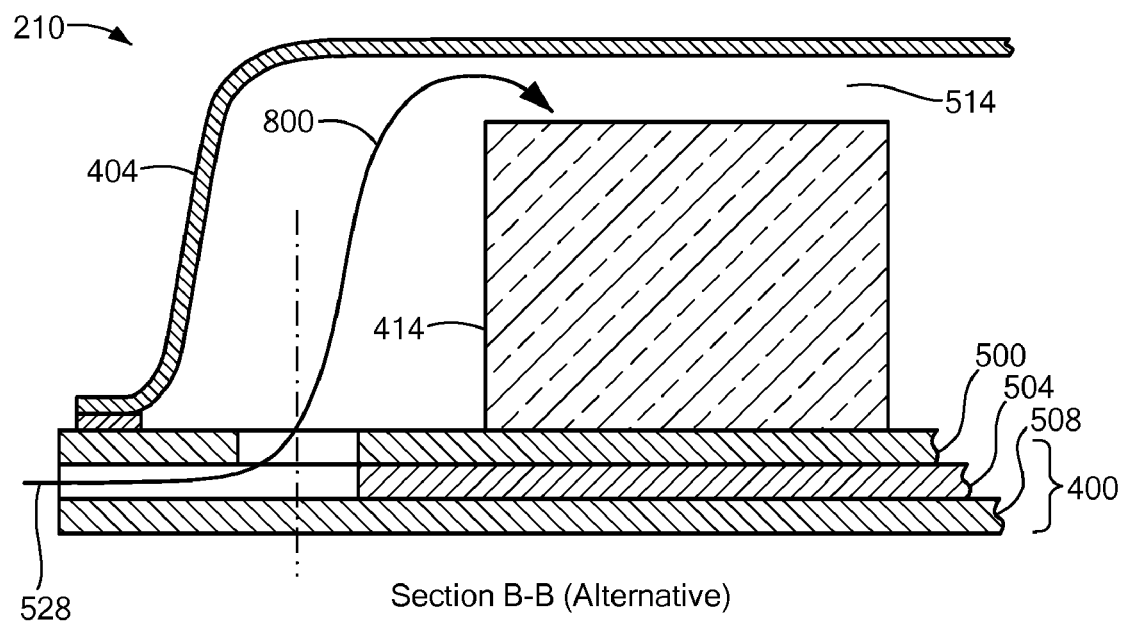
FIG. 8 is a cross-sectional view of a portion of the MEMS microphone package of FIG. 4, according to another embodiment of the present invention.

In the embodiment shown in FIGS. 5 and 6, the portion of the acoustic path 528 defined by the substrate 400 terminates under the microphone die 414. Alternatively, as shown in FIG. 8, the portion of the acoustic path 528 defined by the substrate 400 may terminate in the chamber 514, but spaced away from the microphone die 414. In this case, the top and middle layers 500 and 504 of the substrate are similar to corresponding layers described above, with respect to FIGS. 5-7, although the location of the hole 600 and of the portion 708 of the notch 700 do not necessarily coincide with the location of the microphone die 414. In the embodiment shown in FIG. 8, a portion 800 of the acoustic path 528 extends through the chamber 514. This portion 800 of the acoustic path 528 is not defined by the substrate 400. In addition, the receiver portion of the microphone die 414 may be located at or near the top of the microphone die 414. Some MEMS microphone dies can receive acoustic signals through both ends.

Figure 9:
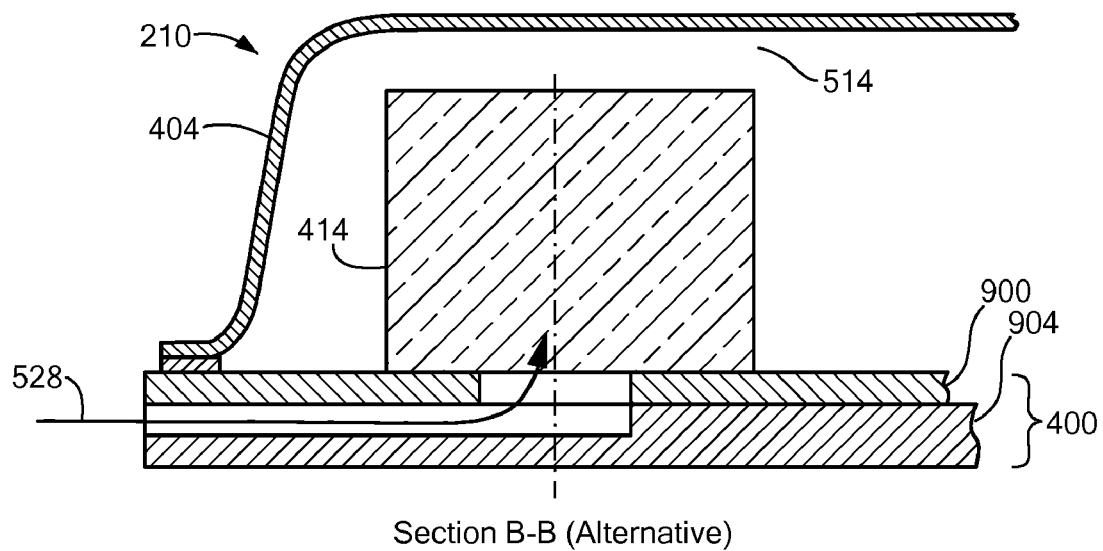
FIG. 9 is a cross-sectional view of a portion of the MEMS microphone package of FIG. 4, according to yet another embodiment of the present invention.
Figure 10:
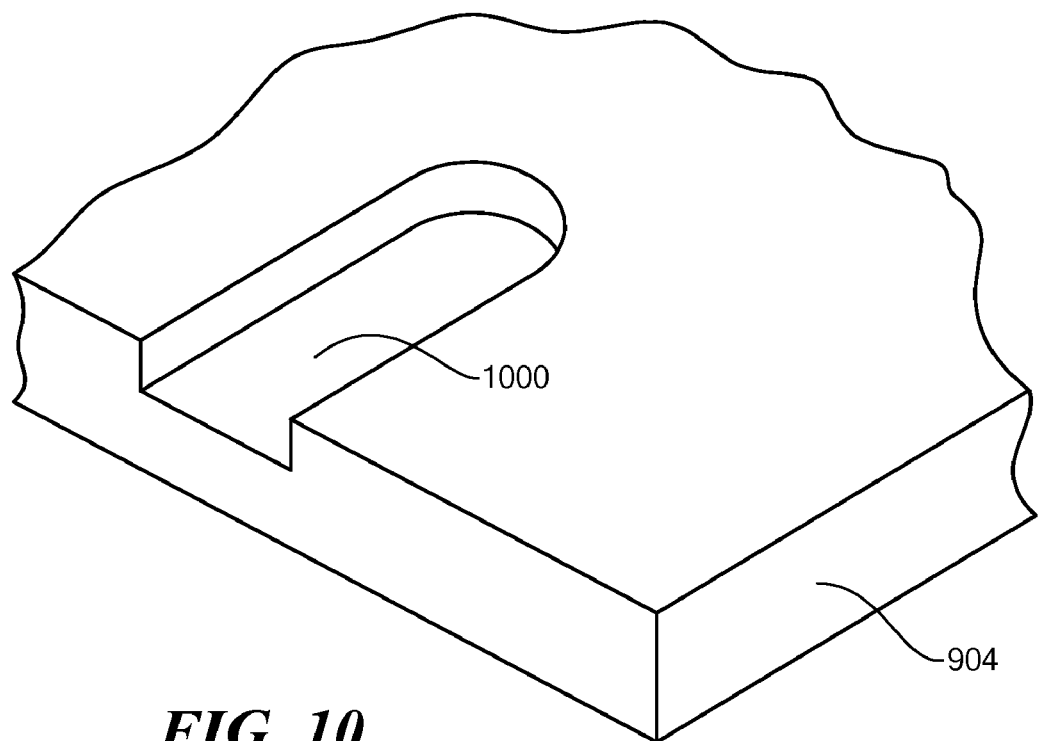
FIG. 10 is a perspective view of a layer of a substrate of the side-ported MEMS microphone package of FIG. 9.

Other numbers of layers, and other configurations of the various layers, may also be used. For example, FIGS. 9 and 10 illustrate another embodiment of the microphone package 210, in which the substrate 400 includes at least two layers 900 and 904. The top layer 900 is similar to the top layer 500 shown in FIGS. 5, 6 and 8. However, the bottom layer 904 has a channel 1000, rather than a notch 700 that extends through the entire thickness of the layer 904, as in the embodiment described with reference to FIG. 7. (A "channel," as used herein, has a bottom portion, as opposed to a "notch," which is open through, from top to bottom.) Such a channel 1000 obviates the need for a separate bottom layer 508, although the bottom layer 904 may need to be thicker than a separate bottom layer 508. As shown in FIG. 9, the acoustic path 528 may terminate under the microphone die 414. Alternatively, the hole and the channel 1000 of the substrate 400 may be located so the acoustic path 528 terminates elsewhere under the lid 404, as described above, with respect to FIG. 8.

Figure 11:
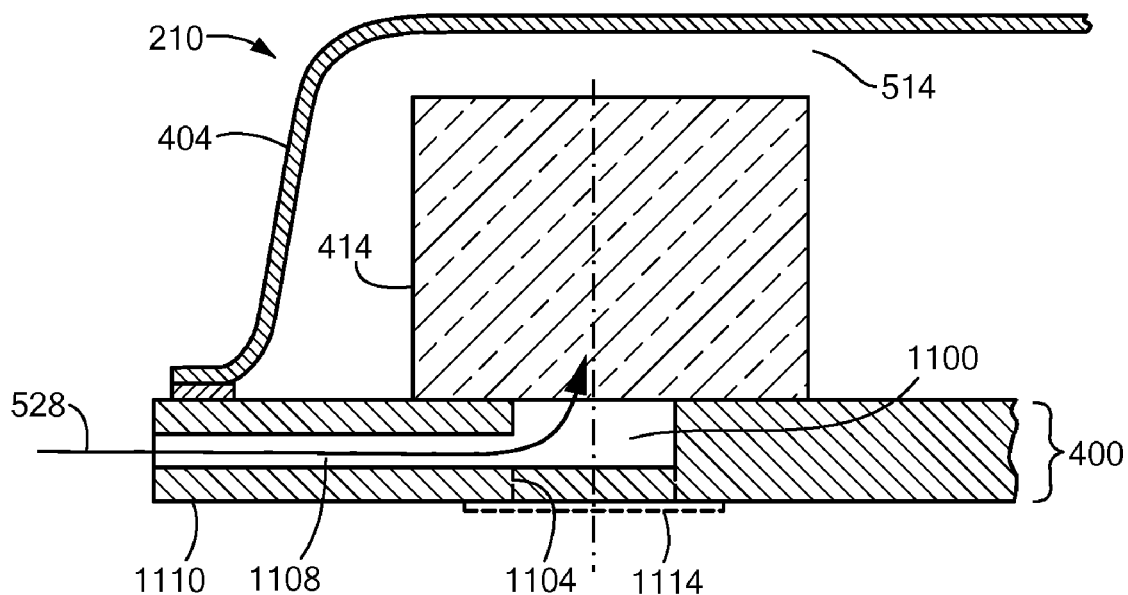
FIG. 11 is a cross-sectional view of a portion of the MEMS microphone package of FIG. 4, according to a different embodiment of the present invention.
Figure 12:
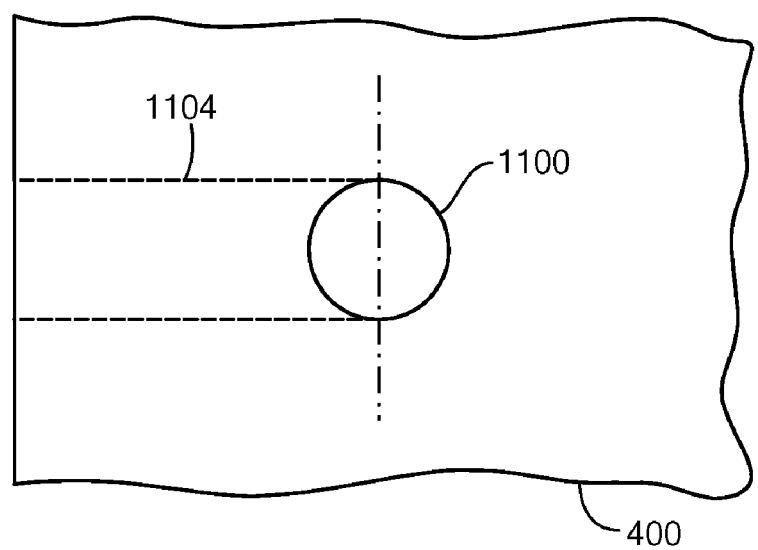
FIG. 12 is a plan view of a substrate of the side-ported MEMS microphone package of FIG. 11.
Figure 13:
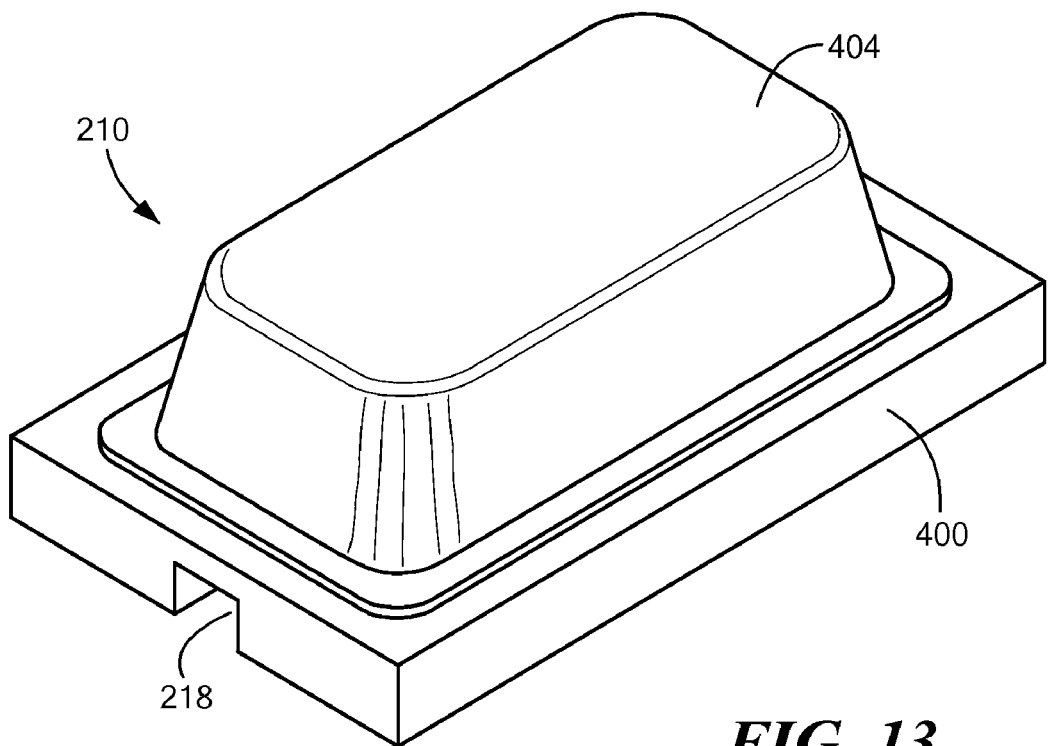
FIG. 13 is a perspective view of a side-ported MEMS microphone package, according to another embodiment of the present invention.

FIGS. 11 and 12 illustrate yet another embodiment of the microphone package 210, in which the acoustic path 528 is formed, such as by drilling, into a solid or laminated substrate 400. For example, a first hole 1100 may be drilled partially or completely (as shown in phantom 1104) through the substrate 400. A second hole 1108 may be drilled to intersect with the first hole 1100. If the first hole 1100 is drilled all the way through the substrate 400, the aperture defined in the bottom surface 1110 of the substrate 400 may be left open and later blocked by a circuit board, to which the microphone package 210 is attached. Alternatively, the aperture may be blocked by applying an adhesive film or tape (shown in phantom 1114) to a portion of the bottom surface 1110. As discussed above, in other embodiments, the first hole 1100 is located so it is not under the microphone die 414. Optionally or alternatively, the holes 1100 and 1108 may be formed as part of an injection molding, punching or other process.

Figure 14:
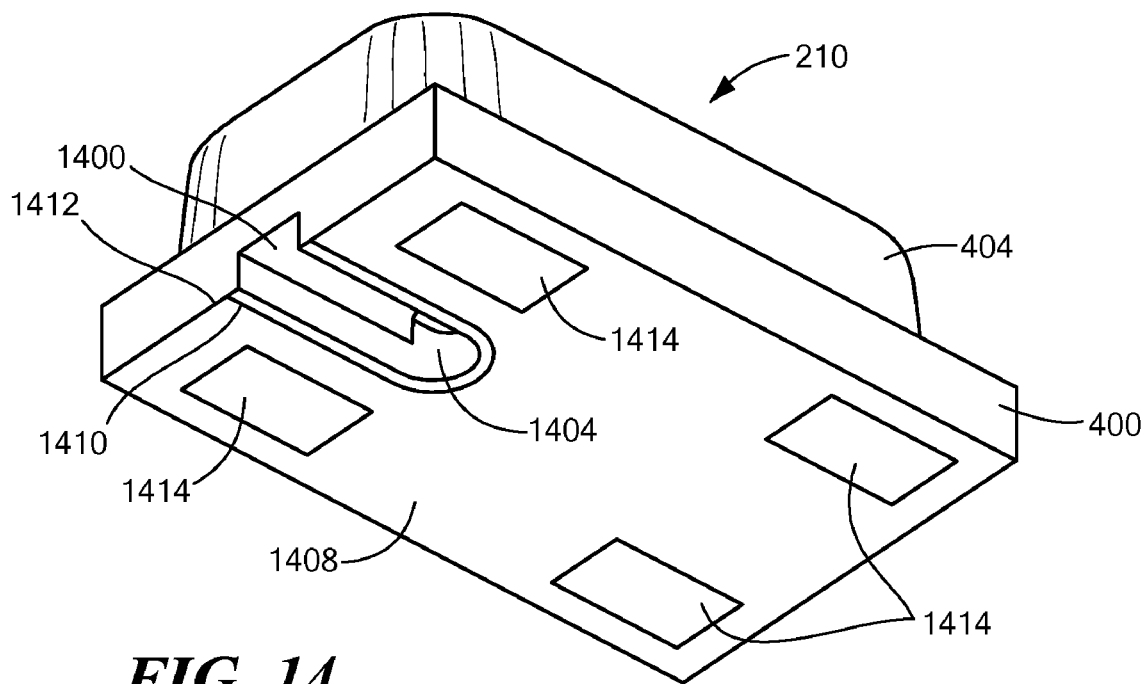
FIG. 14 is a bottom perspective view of the side-ported MEMS microphone package of FIG. 13.

As noted above, if a portion of the acoustic path 528 is open at the bottom of the microphone package 210, the opening may be blocked by an adhesive film or by a circuit board, to which the microphone package 210 is attached. In yet another embodiment shown in FIGS. 13, 14, 15, 16 and 17, a circuit board is used to form a wall of the acoustic path 528. As best seen in FIG. 14, the bottom portion of the substrate 400 defines an open channel 1400 in communication with a hole 1404 that is in communication with a microphone die (not visible). The channel 1400, the hole 1404 and other portions of the acoustic path 528 may be formed by drilling, routing, molding, laminating layers or another process, as described above. The acoustic path 528 may terminate under the microphone die 414 or elsewhere, as described above.

Figure 15:
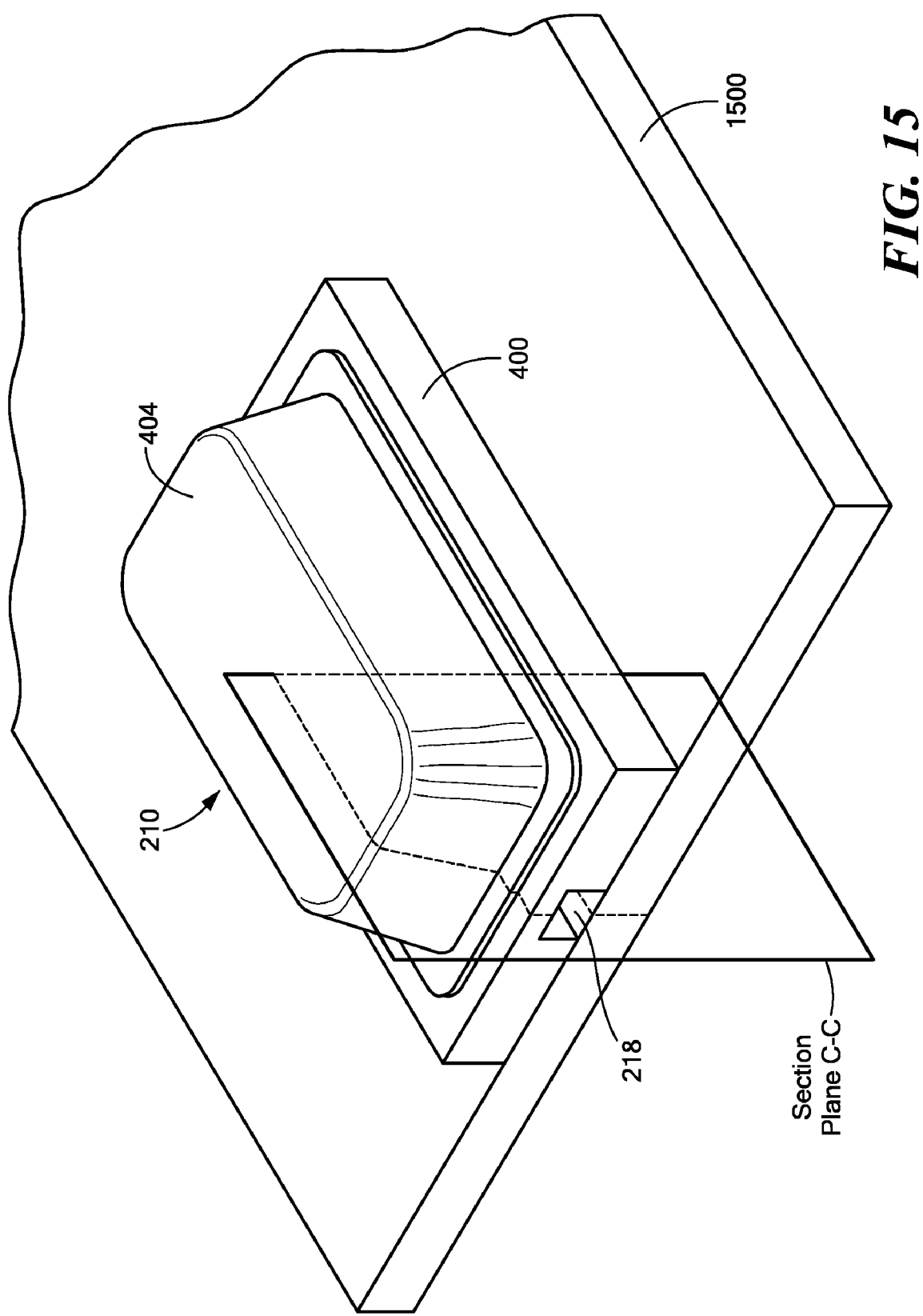
FIG. 15 is a perspective view of the side-ported MEMS microphone package of FIGS. 13 and 14 and a circuit board, according to an embodiment of the present invention.
Figure 16:
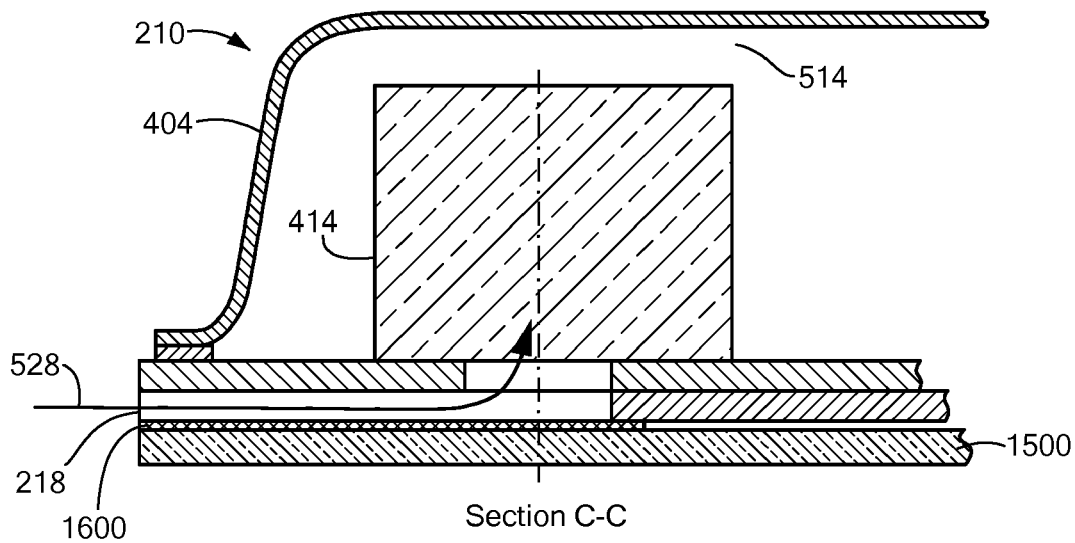
FIG. 16 is a cross-sectional view of a portion of the MEMS microphone package of FIGS. 13-15.

As best seen in FIG. 15, when the microphone package 210 is attached to a circuit board 1500, the open bottom portion of the channel 1400 is blocked by the circuit board 1500. As noted, the microphone package 210 may be attached to the circuit board by solder, an adhesive, or by any other suitable material or method. As best seen in FIG. 14, the bottom surface 1408 of the substrate 400 may include a solderable portion 1410 that follows the outline shape of the channel 1400. The solderable portion 1410 should be configured into an open shape, such as a "U" shape. The solderable portion 1410 should extend from a location proximate (but not necessarily all the way to) an edge 1412 of the substrate 400 to another location proximate the same or another edge of the substrate 400. Thus, the solderable portion 1410 should substantially bound the open portion of the channel 1400 between the solderable portion 1410 and the edge(s) 1412 of the substrate 400, i.e., collectively, the solderable portion 1410 and the edge(s) 1412 form a boundary around the open portion of the channel 1400. As can be see in FIG. 14, the solderable portion 1410 does not completely surround the channel 1400.

Figure 17:
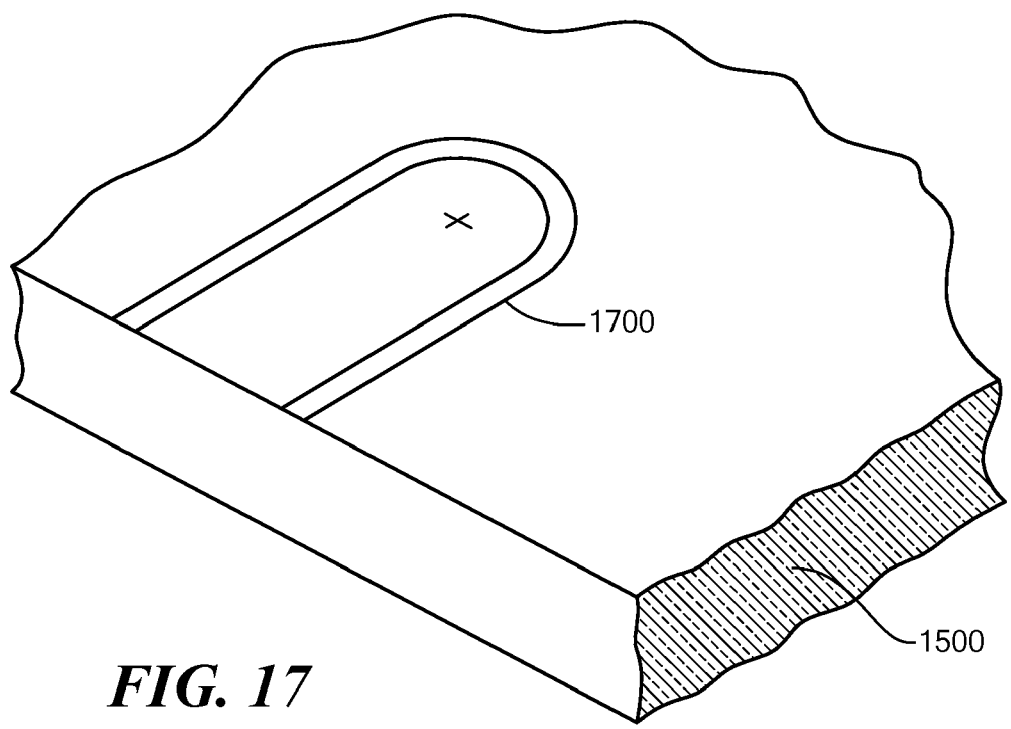
FIG. 17 is a perspective view of a portion of the circuit board of FIG. 15, according to an embodiment of the present invention.
Figure 18:
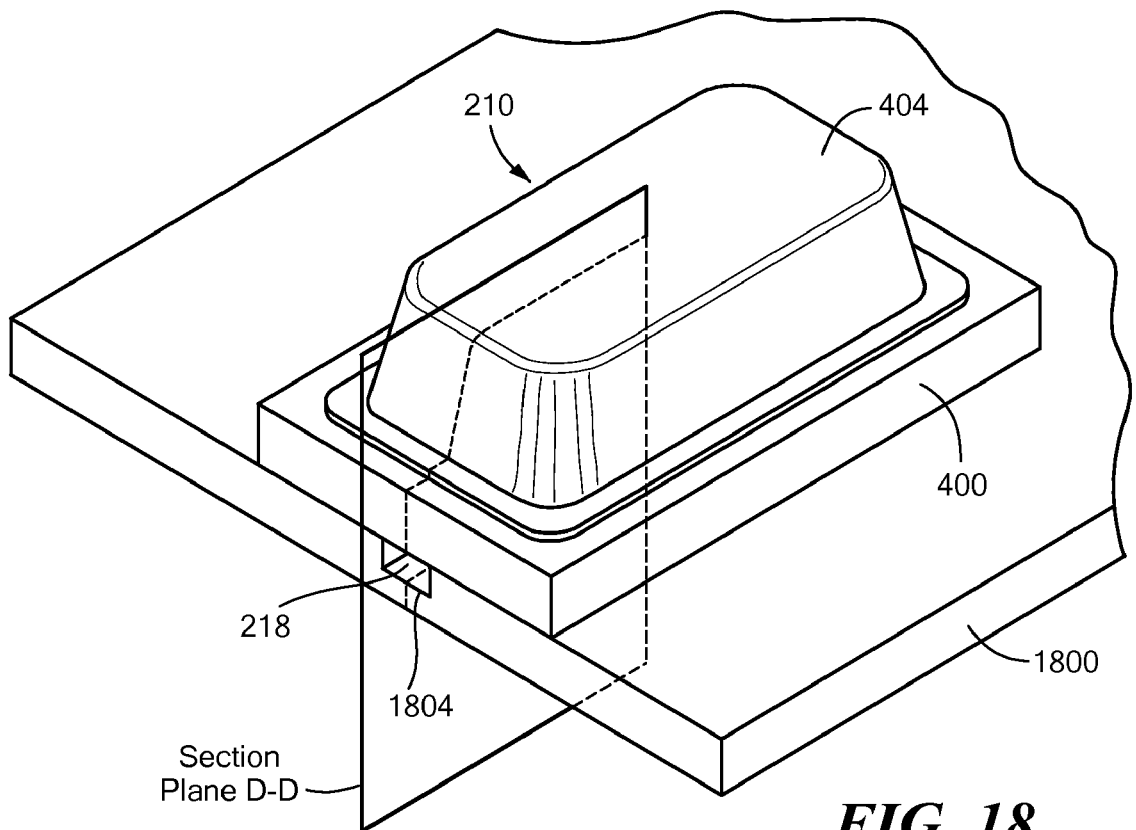
FIG. 18 is a perspective view of a MEMS microphone package and a circuit board, according to another embodiment of the present invention.
Figure 19:
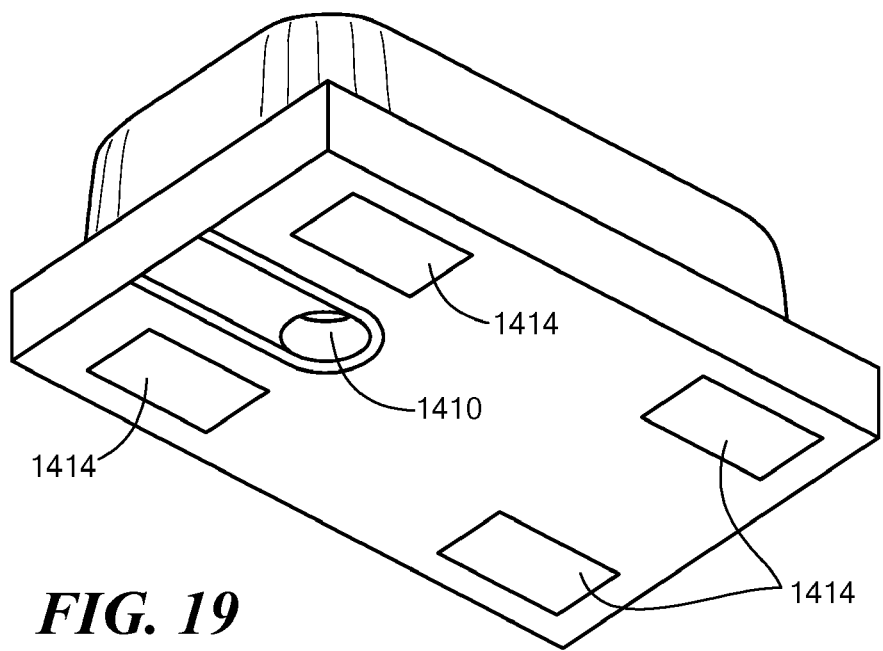
FIG. 19 is a bottom perspective view of the MEMS microphone package of FIG. 18.
Figure 20:
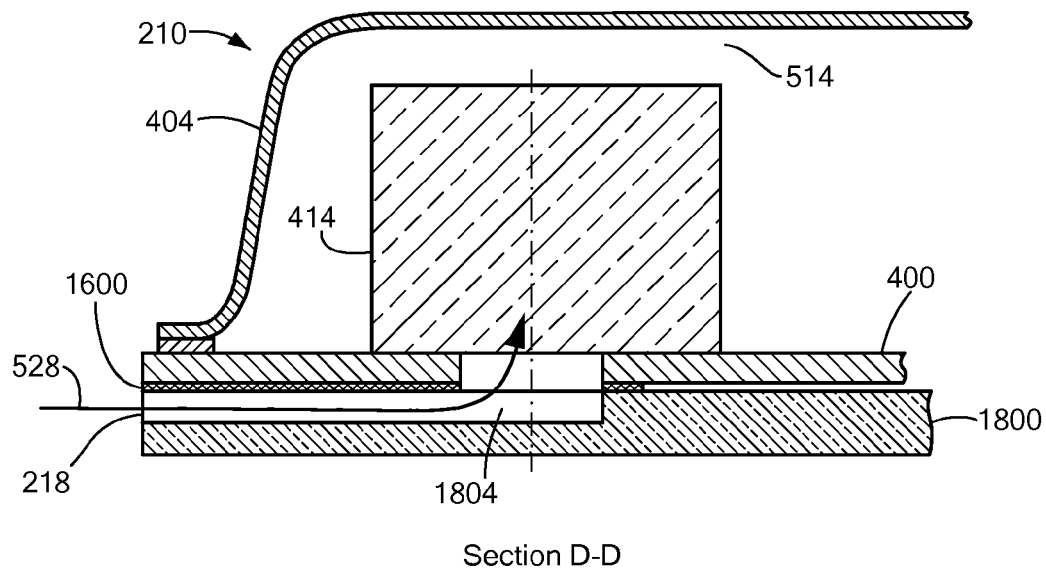
FIG. 20 is a cross-sectional view of a portion of the MEMS microphone package and circuit board of FIGS. 18-19.

As shown in FIG. 17, the circuit board 1500 may also include a solderable portion 1700, shaped similar to the solderable portion 1410 on the bottom of the microphone package 210. When the microphone package 210 is soldered to the circuit board 1500, the solder 1600 (FIG. 16) takes the shape of the solderable portions 1410 and 1700 and, thus, forms the lower portion of a vertical wall of the acoustic path 528. Conventional contact pads 1414 (FIG. 14) provide electrical and additional mechanical connections between the microphone package 210 and the circuit board 1500.

Instead of solder, an adhesive, such as a conductive adhesive, may be used. In this case, the solderable portions 1400 and 1700 may be omitted, or they may be replaced by materials chosen for compatibility with the adhesive.

As shown in FIGS. 18, 19, 20 and 21, a circuit board 1800 may define a channel 1804, and a bottom-ported microphone package may be mounted on the circuit board 1800. If the microphone package is attached to the circuit board 1800 by solder, the bottom of the microphone package may include a solderable portion 1410, as described above, with respect to FIG. 14.

Figure 22:
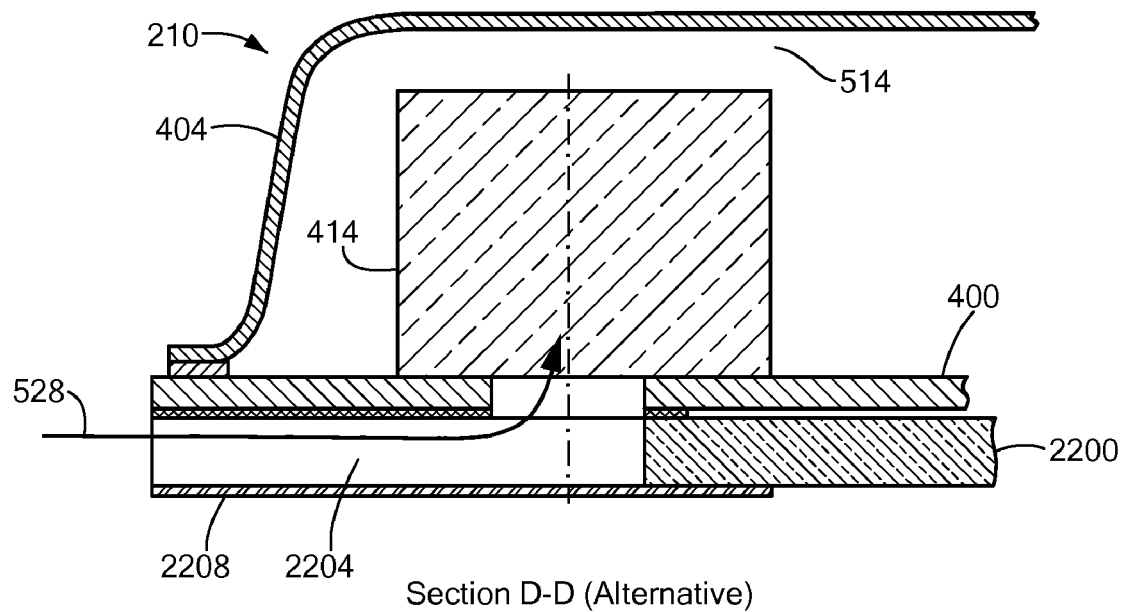
FIG. 22 is a cross-sectional view of a portion of the MEMS microphone package and circuit board of FIGS. 18-19, according to another embodiment of the present invention.
Figure 23:
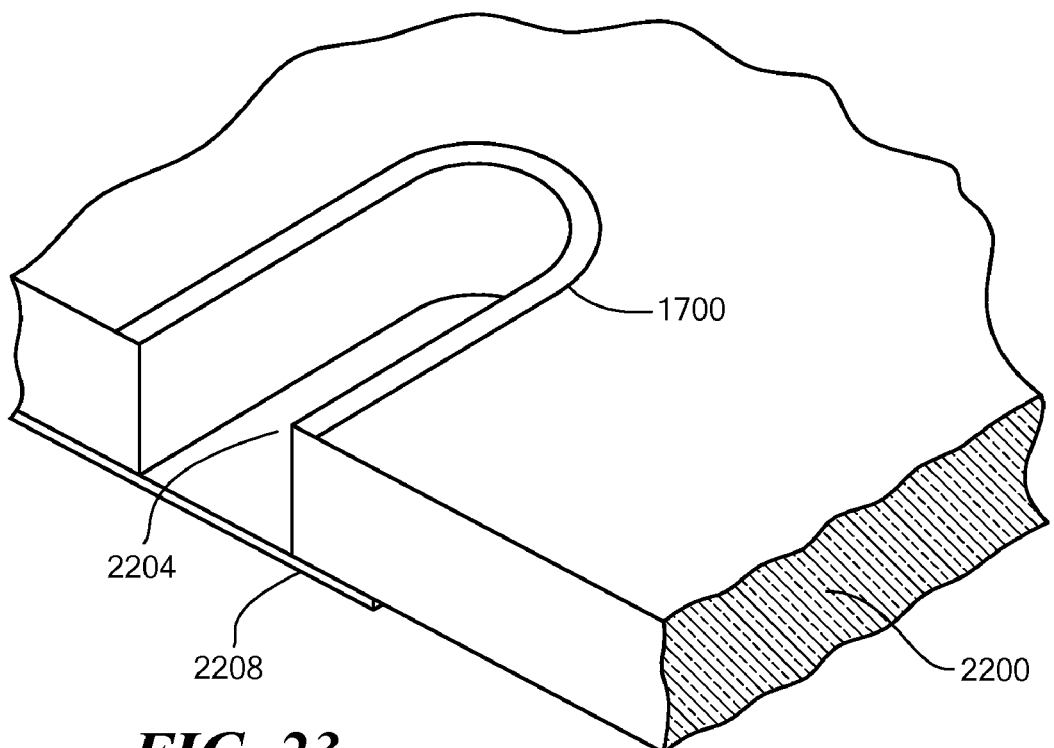
FIG. 23 is a perspective view of a portion of the circuit board of FIGS. 18 and 22.

Alternatively, as shown in FIGS. 22 and 23, a circuit board 2200 may include a notch 2204 (best seen in FIG. 23), rather than a channel 1804. A notch may be easer to form than a channel. The open bottom of the notch 2204 may be sealed with an adhesive film or tape 2208.

Figure 21:
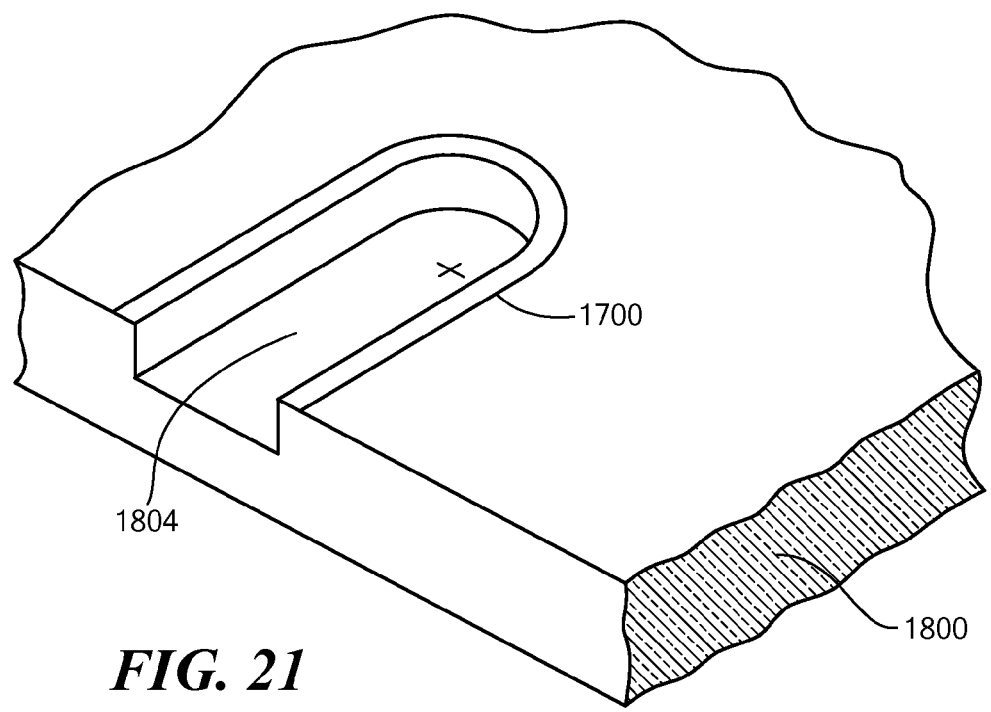
FIG. 21 is a perspective view of a portion of the circuit board of FIGS. 18 and 20, according to an embodiment of the present invention.

Another embodiment combines aspects of the microphone package described with reference to FIG. 15 with aspects of the circuit board described with reference to FIG. 21 or FIG. 23. That is, both the substrate 400 of the microphone package and the circuit board 1800 or 2200 may define channels and/or notches.

Figure 24:
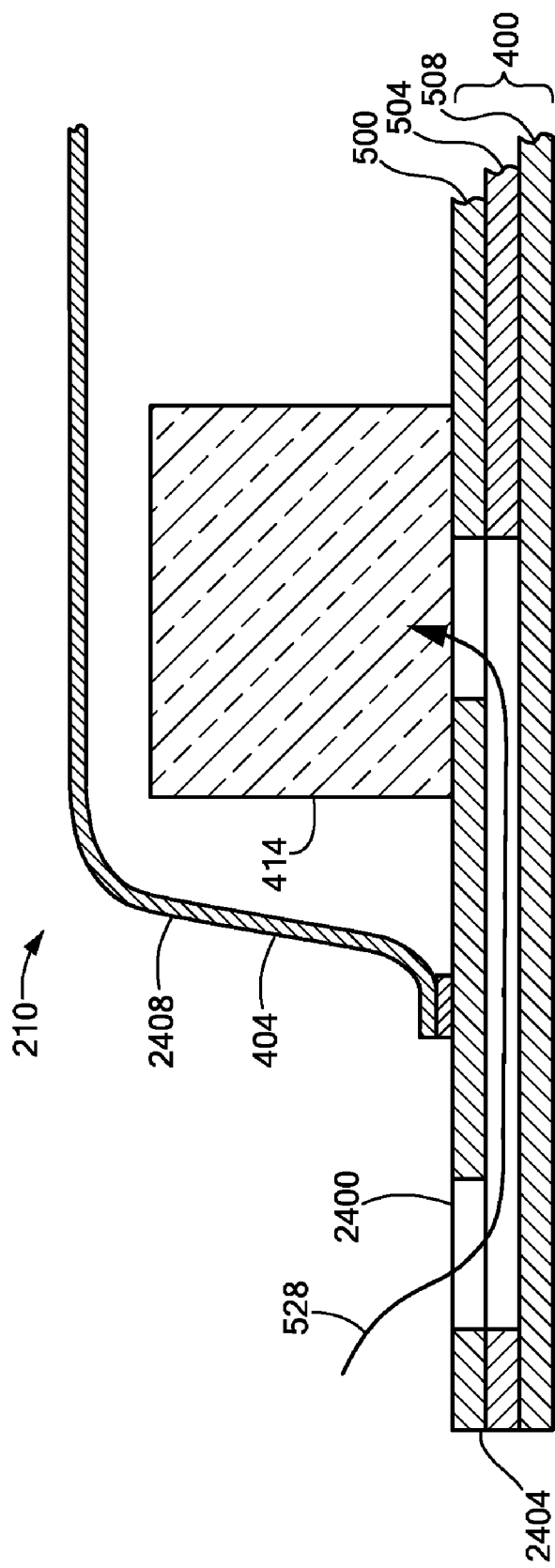
FIG. 24 is a cross-sectional view of a portion of a side-ported MEMS microphone package, according to yet another embodiment of the present invention.

In yet another alternative embodiment, illustrated in FIG. 24, the top layer 500 of the substrate 400 defines an aperture 2400, which functions as the input aperture to the microphone package. Although the aperture 2400 is not on the side 2404 of the substrate 400, the aperture 2400 is closer to the side 2404 than an aperture defined in the side 2408 of the lid 404 would be. A suitable gasket should be used with the microphone package 210 illustrated in FIG. 24, as discussed with reference to the gasket 220 shown in FIGS. 1-3.

Figure 25:
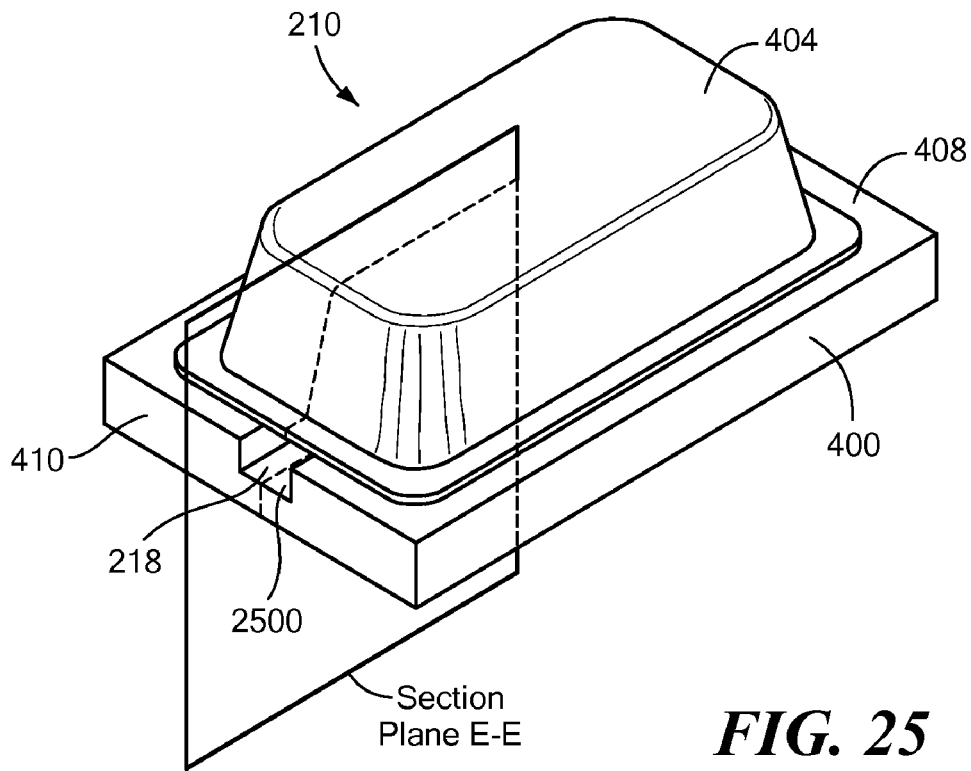
FIG. 25 is a perspective view of a side-ported MEMS microphone package, according to an embodiment of the present invention.
Figure 26:
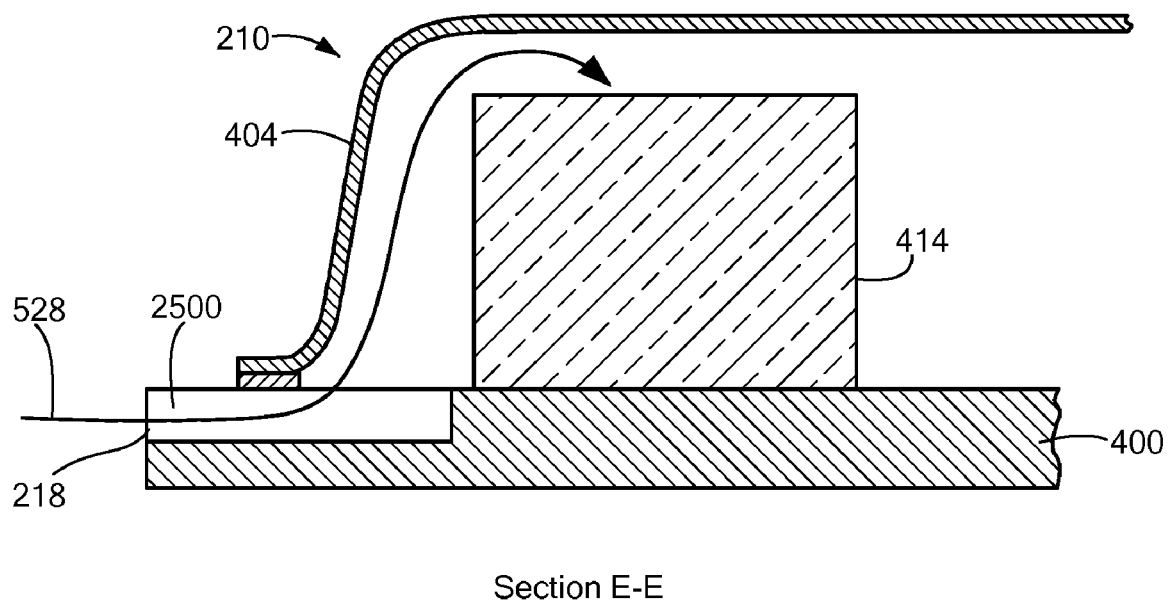
FIG. 26 is a cross-sectional view of a portion of the MEMS microphone package of FIG. 25.

In another embodiment, illustrated in FIGS. 25 and 26, the substrate 400 defines a channel 2500, which forms at least part of the acoustic path 528. The comments regarding a gasket made in reference to FIG. 24 also apply to this embodiment.

Figure 27:
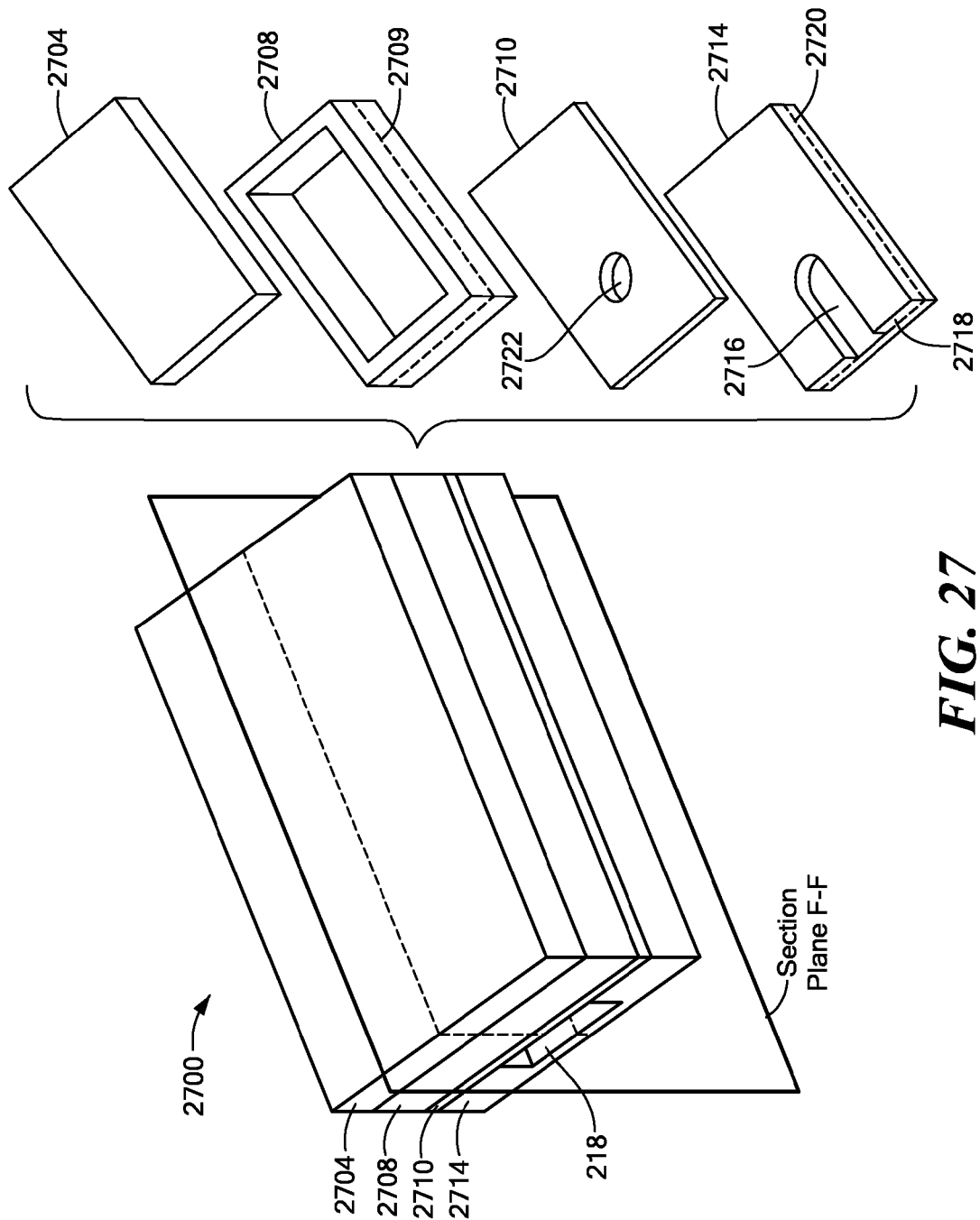
FIG. 27 is a perspective and an exploded view of a side-ported MEMS microphone package, according to another embodiment of the present invention.
Figure 28:
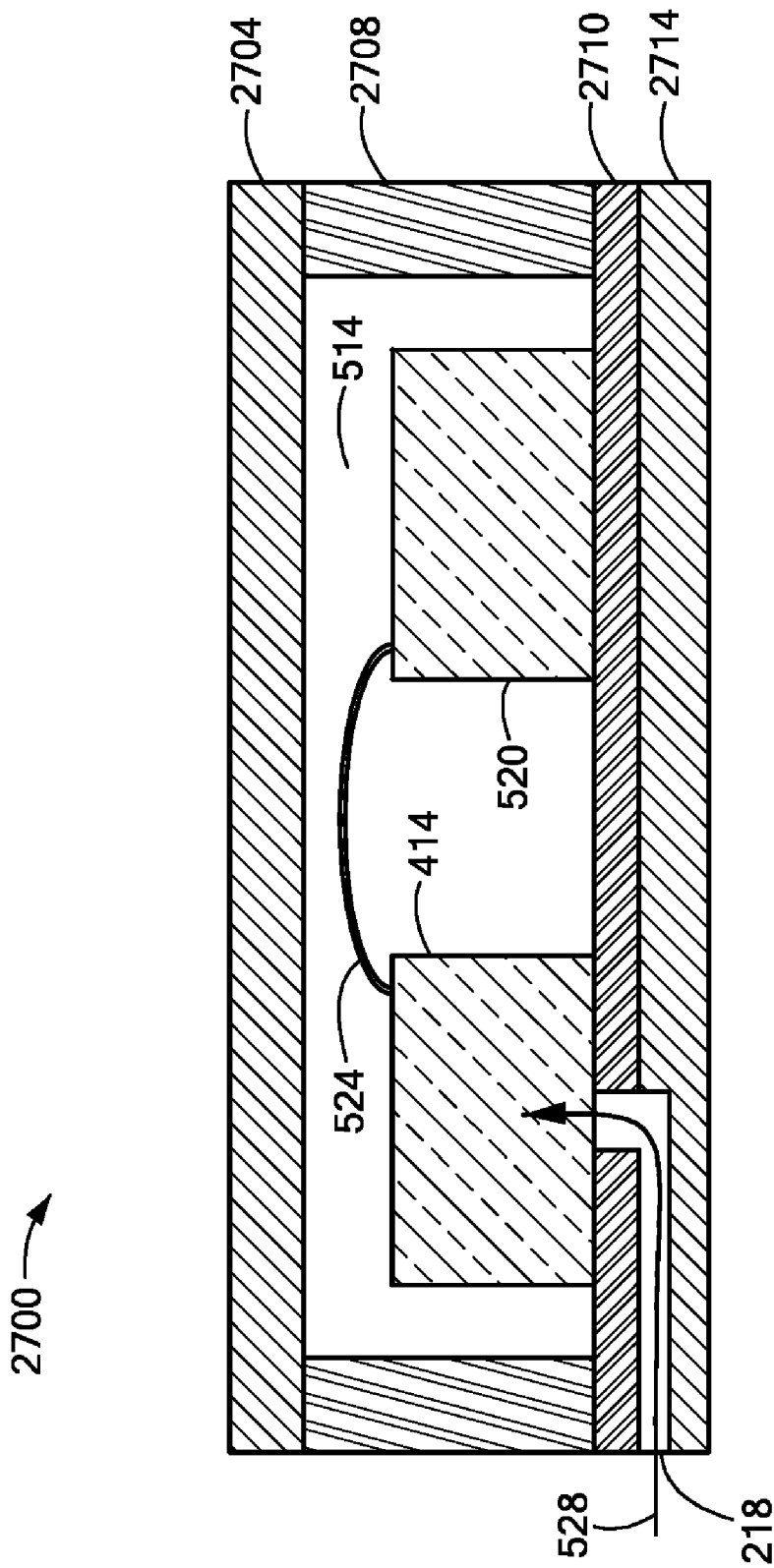
FIG. 28 is a cross-sectional view of the MEMS microphone package of FIG. 27.

FIGS. 27 and 28 illustrate a microphone package 2700, according to yet another embodiment of the present invention. FIG. 27 shows the microphone package 2700 in assembled and exploded views. The microphone package 2700 includes a top layer or lid 2704 and a wall layer 2708. The wall layer 2708 may be made of one or more individual layers, as exemplified by dashed line 2709. The microphone package 2700 also includes a channel layer 2714 that defines a hollow channel 2716. The channel 2716 extends from an edge 2718 of the channel layer 2714 to a location away from the edge 2718, such as to a location over which a microphone die (not shown) may be attached. The channel layer 2714 may be made of one or more individual layers, as exemplified by dashed line 2720.

A bore layer 2710 defines a hole 2720 and is disposed intermediate the wall layer 2708 and the channel layer 2714, such that when the channel layer 2714 and bore layer 2710 are assembled in registration with each other, the hole 2720 is in communication with the channel 2716. When the wall layer 2708 and the bore layer 2710 are assembled in registration with each other, the hole 2720 is in communication with a volume defined by the wall layer 2708.

The microphone package 2700 (or any other embodiment) may be provided as a kit of parts that includes the various layers 2704, 2708, 2710 and 2714 described above. The layers 2704-2714 may be made of plastic, ceramic or any other suitable material. The layers may be assembled using any suitable technique. For example, plastic layers may be assembled using an adhesive or welding by heat, ultrasonic energy or solvent, and ceramic layers may be assembled by brazing.

Figure 29:
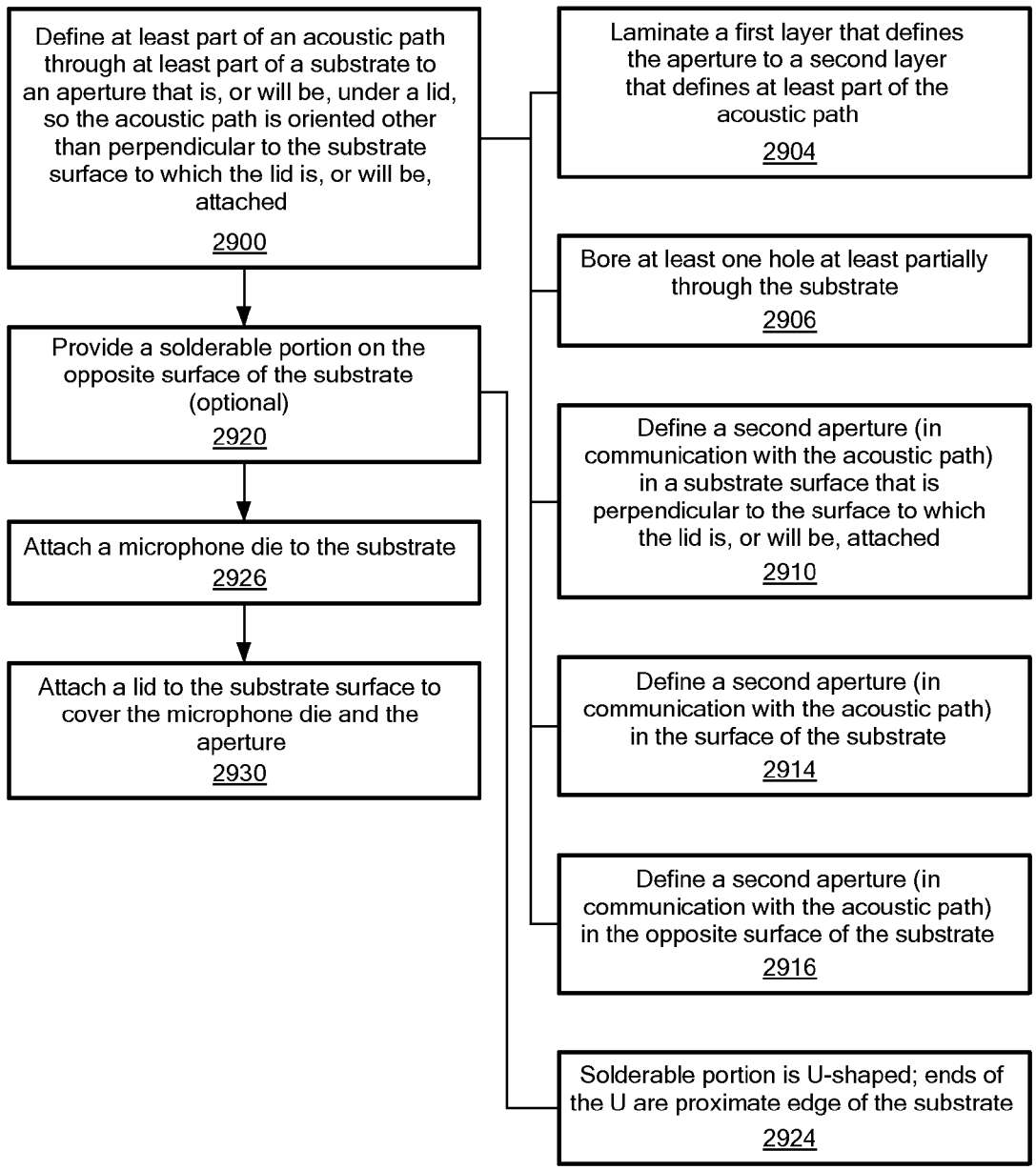
FIG. 29 is a flowchart that describes producing a side-ported MEMS microphone package, according to embodiments of the present invention.

FIG. 29 is a flowchart that describes producing a side-ported MEMS microphone package, according to one embodiment of the present invention. At 2900, at least part of an acoustic path is defined through at least a part of a substrate to an aperture that is, or will be, under a lid, so the acoustic path is oriented other than perpendicular to the substrate surface to which the lid is, or will be, attached. As noted, the acoustic path may be defined in various ways, including laminating layers that each defines one or more holes, notches, channels, etc. For example, as indicated at 2904, a first layer that defines the aperture may be laminated to a second layer that at least partially defines the acoustic path, such as by a notch, channel, etc. Optionally or alternatively, as indicated at 2906, one or more holes may be bored at least partially through the substrate to define at least part of the acoustic path.

Optionally or alternatively, as indicated at 2910, a second aperture may be defined in a substrate surface that is perpendicular to the surface to which the lid is, or will be, attached. The second aperture is in communication with the acoustic path.

Optionally or alternatively, as indicated at 2914, a second aperture may be defined in the surface of the substrate. The second aperture is in communication with the acoustic path.

Optionally or alternatively, as indicated at 2916, a second aperture may be defined in the surface of the substrate opposite the surface to which the lid is, or will be, mounted. The second aperture is in communication with the acoustic path.

Optionally, a solderable portion may be provided on the surface of the substrate opposite the surface to which the lid is, or will be, mounted, as indicated at 2920. As noted at 2924, the solderable portion may be in a U shape.

At 2926, a MEMS microphone die is attached to the surface of the substrate. At 2930, a lid is attached to the substrate surface to cover the microphone die and the aperture defined in the surface.

Figure 30:
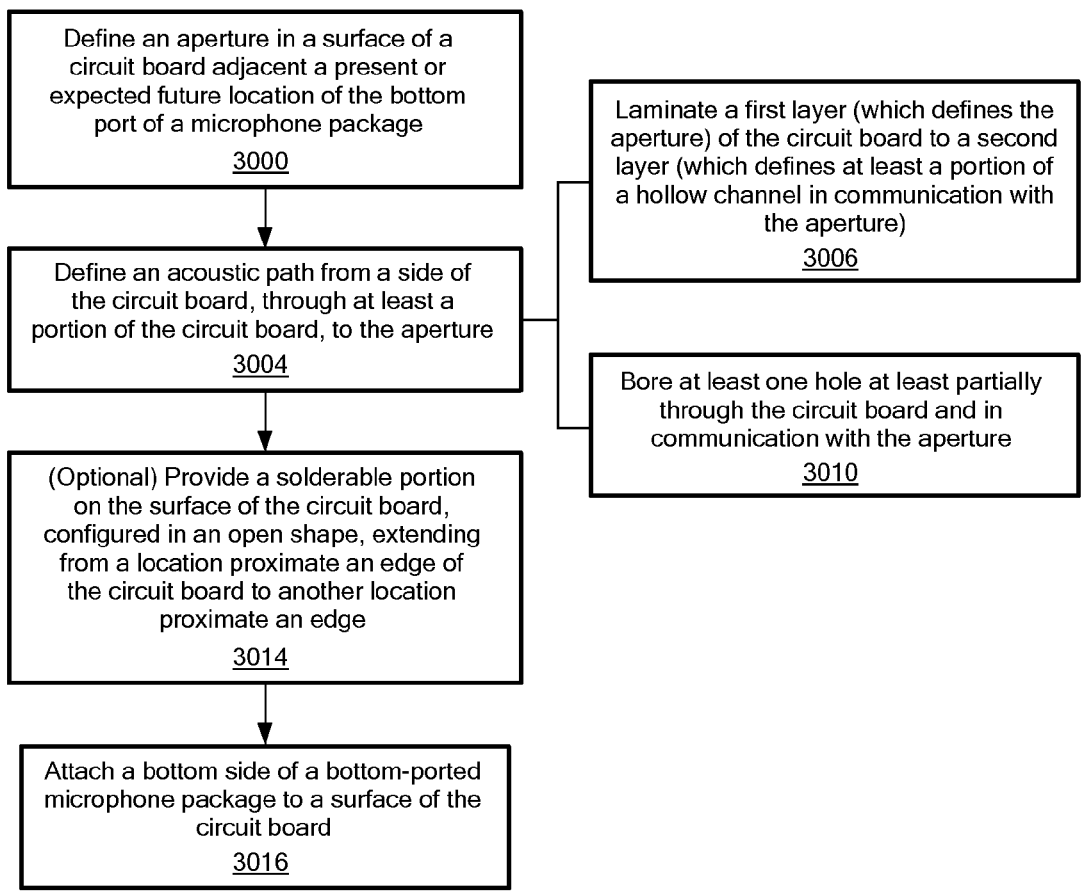
FIG. 30 is a flowchart that describes producing a side-ported MEMS microphone assembly, according to another embodiment of the present invention.

As noted, a circuit board may define a portion of the acoustic path. FIG. 30 is a flowchart that describes producing a side-ported MEMS microphone assembly, according to another embodiment of the present invention. At 3000, an aperture is defined in a surface of a circuit board adjacent a present or expected future location of the bottom port of a MEMS microphone package. At 3004, an acoustic path is defined from a side of the circuit board, through at least a portion of the circuit board, to the aperture. The acoustic path may be defined in various ways, including laminating layers that each defines one or more holes, notches, channels, etc. For example, at 3006, a first layer of the circuit board is laminated to a second layer of the circuit board. The first layer defines the aperture. The second layer defines at least a portion of a hollow channel in communication with the aperture. Optionally or alternatively, as indicated at 3010, one or more holes may be bored at least partially through the circuit board to define at least part of the acoustic path.

Optionally, a solderable portion may be provided on the surface of the circuit board, as indicated at 3014. The solderable portion is configured in an open shape, such as a U shape, and the solderable portion extends from a location proximate an edge of the circuit board to another location proximate the edge of the circuit board.

At 3016, a bottom side of a bottom-ported MEMS microphone package is attached to the surface of the circuit board, so the bottom port of the microphone package is in communication with the aperture in the surface of the circuit board.

While the invention is described through the above-described exemplary embodiments, it will be understood by those of ordinary skill in the art that modifications to, and variations of, the illustrated embodiments may be made without departing from the inventive concepts disclosed herein. For example, although some aspects of producing side-ported microphone packages and assemblies have been described with reference to flowcharts, those skilled in the art should readily appreciate that functions, operations, decisions, etc. of all or a portion of each block, or a combination of blocks, of the flowchart may be combined, separated into separate operations or performed in other orders. In addition, although a microphone package has been described as being made from various materials, the disclosed methods and structures may be used with other materials. Furthermore, disclosed aspects, or portions of these aspects, may be combined in ways not listed above. Accordingly, the invention should not be viewed as being limited to the disclosed embodiment(s).

What is claimed is:

1. A side-ported microphone package, comprising:
a substrate having a first surface and a second surface, the second surface being on substantially an opposite side of the substrate from the first surface;
a lid attached to the first surface of the substrate to define a chamber therebetween; and
a microphone die disposed within the chamber;
wherein:
the second surface defines an opening;
the substrate at least partially defines an acoustic path between the opening and the microphone die; and
the second surface comprises a solderable portion configured into an open shape, extending from a location proximate an edge of the substrate to another location proximate an edge of the substrate, so as to substantially bound the opening between the solderable portion and the edge of the substrate, wherein the solderable portion does not surround the opening.

2. A side-ported microphone package according to claim 1, wherein at least a portion of the acoustic path is oriented parallel to the first surface of the substrate.

3. A side-ported microphone package according to claim 1, wherein:
   a locus of points where the lid is attached to the substrate defines a boundary;
   the opening is outside the boundary;
   the substrate defines:
      an aperture in the first surface within the boundary; and
      a hollow passage in communication with the aperture and with the opening, such that the hollow passage, the aperture and the opening form at least a portion of the acoustic path.

4. A side-ported microphone package according to claim 3, wherein the opening is defined at least in part by a surface of the substrate that is substantially perpendicular to the first surface.

5. A side-ported microphone package according to claim 1, wherein the solderable portion is U shaped, with ends of the U shape proximate the edge of the substrate.

6. A side-ported microphone package according to claim 3, wherein:
   the substrate comprises a laminate;
   a first layer of the laminate defines the aperture; and
   a second layer of the laminate defines at least a portion of the hollow passage.

7. A side-ported microphone package according to claim 3, wherein the aperture is adjacent to, and in line with, a receiver portion of the microphone die.

8. A side-ported microphone package according to claim 3, wherein the microphone die is disposed between the aperture and the chamber.

9. A side-ported microphone package according to claim 3, wherein the aperture is in communication with the chamber.

10. A side-ported microphone package according to claim 1, wherein the substrate comprises a printed circuit board.

11. A side-ported microphone package according to claim 1, wherein the substrate comprises ceramic.

12. A side-ported microphone package according to claim 1, wherein the substrate comprises plastic.

13. A side-ported microphone package according to claim 1, wherein the substrate comprises at least one wall, and the lid is attached to the at least one wall.

14. A kit of parts for assembling a side-ported microphone package, the kit comprising:
   a first layer defining at least one of a hollow channel and a notch in a surface of the first layer, the hollow channel or notch, as the case may be, extending from an edge of the first layer and terminating at a location away from any edge of the first layer, the surface of the first layer comprises a solderable portion configured into an open shape, extending from a location proximate the edge of the first layer to another location proximate the edge of the first layer, so as to substantially bound the channel or notch between the solderable portion and the edge of the first layer, wherein the solderable portion does not surround the channel or notch;
   a second layer defining a bore, such that when the first and second layers are assembled in registration with each other, the bore is in communication with the channel or notch;
   at least one wall configured such that when the at least one wall is attached to the second layer in registration therewith, the bore is in communication with a volume defined by the at least one wall; and
   a lid.

15. A kit of parts as recited in claim 14, wherein the first layer comprises a printed circuit board, and the second layer comprises a printed circuit board.

16. A kit of parts as recited in claim 15, wherein the lid comprises a printed circuit board.

17. A kit of parts as recited in claim 14, wherein the lid comprises a printed circuit board.

18. A kit of parts as recited in claim 14, wherein the first layer, the second layer, the at least one wall and the lid comprise ceramic.

19. A kit of parts as recited in claim 14, wherein the first layer, the second layer, the at least one wall and the lid comprise plastic.

20. A method for producing a side-ported microphone package, the method comprising:
   disposing a microphone die, relative to a substrate;
   attaching a lid to a first surface of the substrate to define a chamber within which at least one of:
      the microphone die is disposed and
      the microphone die will be disposed;
   defining an opening in a second surface of the substrate, outside the chamber, the second surface being on a substantially opposite side of the substrate from the first surface;
   providing a solderable portion on the second surface, the solderable portion being configured into an open shape, extending from a location proximate an edge of the substrate to another location proximate an edge of the substrate, so as to substantially bound the opening between the solderable portion and the edge of the substrate, wherein the solderable portion does not surround the opening;
   defining at least a portion of an acoustic path from the opening, through at least a portion of the substrate, to an aperture defined by the first surface within a boundary defined by a locus of points where at least one of the lid is attached and the lid will be attached to the substrate.

21. A method according to claim 20, wherein defining the at least a portion of the acoustic path comprises laminating a plurality of layers of the substrate, wherein a first layer of the substrate defines the first aperture; and a second layer of the substrate defines at least a portion of the acoustic path.

22. A method according to claim 20, wherein defining the at least a portion of the acoustic path comprises boring at least one hole at least partially through the substrate.

23. A method according to claim 20, wherein the solderable portion is U shaped, with ends of the U shape proximate the edge of the substrate.

24. A method for producing a side-ported microphone assembly, the method comprising:
   attaching a bottom side of a bottom-ported microphone package to a surface of a circuit board;
   defining an opening in the surface of the circuit board adjacent at least one of a present and an expected future location of the bottom port of the microphone package;
   defining a hollow acoustic path from a side of the circuit board, through at least a portion of the circuit board, to the opening; and
   providing a solderable portion on the surface of the circuit board, the solderable portion being configured into an open shape, extending from a location proximate an edge of the circuit board to another location proximate an edge of the circuit board, so as to substantially bound the opening between the solderable portion and the edge of the circuit board, wherein the solderable portion does not surround the opening.

25. A method according to claim 24, wherein defining the acoustic path comprises laminating a plurality of layers of the circuit board, wherein a first layer of the circuit board defines the opening, and a second layer of the circuit board defines at least a portion of a hollow passage in communication with the opening and extending to the side of the circuit board.

26. A method according to claim 24, wherein defining the acoustic path comprises boring at least one hole at least partially through the circuit board, the hole being in communication with the opening.

\* \* \* \* \*